United States Patent
Arai et al.

(10) Patent No.: US 7,393,748 B2
(45) Date of Patent: Jul. 1, 2008

(54) METHOD OF FABRICATING A SEMICONDUCTOR MEMORY DEVICE

(75) Inventors: Fumitaka Arai, Yokohama (JP); Toshiyuki Enda, Zushi (JP); Hiroyoshi Tanimoto, Yokohama (JP); Naoki Kusunoki, Yokohama (JP); Nobutoshi Aoki, Yokohama (JP); Riichiro Shirota, Fujisawa (JP); Hiroshi Watanabe, Yokohama (JP); Takamitsu Ishihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/609,614

(22) Filed: Dec. 12, 2006

(65) Prior Publication Data

US 2007/0138536 A1    Jun. 21, 2007

(30) Foreign Application Priority Data

Dec. 13, 2005  (JP)  ............................. 2005-359072

(51) Int. Cl.
    *H01L 21/33* (2006.01)
(52) U.S. Cl. ................... 438/258; 438/266; 257/315
(58) Field of Classification Search ............ 438/258
    See application file for complete search history.

(56) References Cited

U.S. PATENT DOCUMENTS

2006/0249773 A1* 11/2006 Kai ............................ 257/301
2007/0138576 A1*  6/2007 Mizukami et al. ......... 257/390

FOREIGN PATENT DOCUMENTS

| JP | 7-94612 | 4/1995 |
| JP | 11-163303 | 6/1999 |
| JP | 2000-174241 | 6/2000 |

OTHER PUBLICATIONS

U.S. Appl. No. 11/834,886, filed Aug. 7, 2007, Watanabe, et al.

* cited by examiner

*Primary Examiner*—Thao X. Le
*Assistant Examiner*—Kimberly Trice
(74) *Attorney, Agent, or Firm*—Oblon, Spivak, McClelland & Neustadt, P.C.

(57) ABSTRACT

A NAND cell unit is formed with an advanced gate forming process on a semiconductor layer of a first conductivity type, which is formed on a semiconductor substrate of the first conductivity type with an insulating film interposed therebetween. First impurity-doped layers of a second conductivity type are formed on the semiconductor layer, which serve as channel regions of the select gate transistors Bit line contact- and source line contact-use second impurity-doped layers of the first conductivity type are formed at bit line and source line contact portions, sidewalls of which are covered with an insulating film.

17 Claims, 25 Drawing Sheets

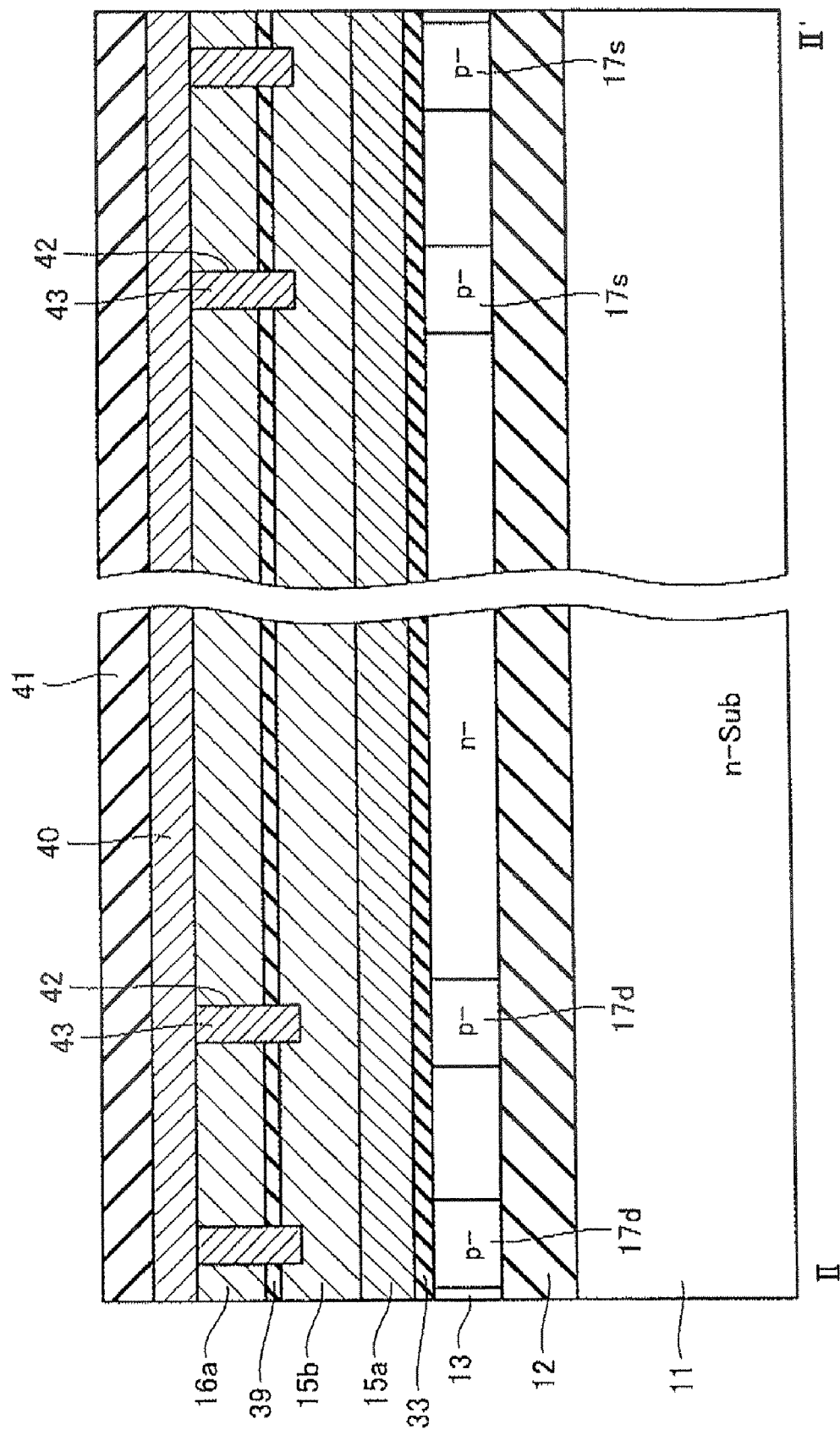

//. # METHOD OF FABRICATING A SEMICONDUCTOR MEMORY DEVICE

CROSS-REFERENCE TO RELATED APPLICATION

This application is based on and claims the benefit of priority from the prior Japanese Patent Application No. 2005-359072, filed on Dec. 13 2005, the entire contents of which are incorporated herein by reference.

BACKGROUND OF THE INVENTION

1. Field of the Invention

This invention relates to a method of fabricating a semiconductor memory device, especially relates to a NAND-type flash memory with an SOI (Silicon-On-Insulator) substrate 2. Description of the Related Art A NAND-type flash memory is known as one of electrically rewritable and non-volatile semiconductor memories (EEPROMs). The NAND-type flash memory has such a basic feature that the unit cell area is smaller than that of a NOR-type flash memory, and it is easy to make the capacity large. Further, data read or write of the cell array being performed by a page, it is possible to perform high-speed read and write.

Further miniaturization of a memory cell in accordance with progress of microfabrication technologies will bring some problems in the NAND-type flash memory such as: it becomes difficult to secure the breakdown voltage between cells; and the capacitive coupling noise between cells is increased. One approach to solve these problems is to use such a technology that the cell array is formed on an SOI (Silicon-On-Insulator) substrate. There have already been provided such SOI technologies (for example, refer to (1) Unexamined Japanese Patent Application Publication No. 07-094612, (2) Unexamined Japanese Patent Application Publication No.11-163303, and (3) Unexamined Japanese Patent Application Publication No. 2000-174241).

SUMMARY OF THE INVENTION

According to an aspect of the present invention, there is provided a method of fabricating a semiconductor memory device with a memory cell array, in which a plurality of memory cells are connected in series and select gate transistors are disposed at both ends thereof, each memory cell having a floating gate and a control gate stacked thereabove, including:

forming first impurity-doped layers on a semiconductor layer of a first conductivity type formed over a semiconductor substrate of the first conductivity type with a first insulating film interposed therebetween, the first impurity-doped layers being of a second conductivity type and serving as channel regions of the select gate transistors;

etching the semiconductor layer, on which a floating gate-use electrode material film is formed with a gate insulating film interposed therebetween, to form stripe-shaped device formation areas;

forming a control gate-use electrode material film on the floating gate-use electrode material film with an inter-gate dielectric film interposed therebetween;

selectively etching the control gate-use electrode material film as to penetrate the floating gate-use electrode material film, thereby forming floating gates and control gates of the memory cells and gate electrodes of the select gate transistors;

forming a second insulating film to be buried between the respective memory cells and between the select gate transistors and the memory cells and cover the side walls of the openings at bit line and source line contact portions; and forming second impurity-doped layers of the first conductivity type on the semiconductor layer at the bit line and source line contact portions.

According to another aspect of the present invention, there is provided a method of fabricating a semiconductor memory device with a memory cell array, in which a plurality of memory cells are connected in series and select gate transistors are disposed at both ends thereof, each memory cell having a floating gate and a control gate stacked thereabove, including:

forming first impurity-doped layers on a semiconductor layer of a first conductivity type formed over a semiconductor substrate of the first conductivity type with a first insulating film interposed therebetween, the first impurity-doped layers being of a second conductivity type and serving as channel regions of the select gate transistors;

forming a first gate electrode material film on the semiconductor layer with a tunnel insulating film interposed therebetween;

etching from the first gate electrode material film to the semiconductor layer to form stripe-shaped device formation areas in a state that the device formation areas are covered with the first gate electrode material film and separated from each other;

burying a second insulating film between the device formation areas;

forming a second gate electrode material film on the device formation areas to be stacked on the first gate electrode material film;

etching the second gate electrode material film to form separating grooves on the second insulating film;

forming a third gate electrode material film of the second gate electrode material film with an inter-gate dielectric film interposed therebetween;

etching from the third gate electrode material film to the first gate electrode material film to form a multiple control gate lines and select gate lines disposed at both sides thereof, which are formed of the third gate electrode material film, and floating gates of the memory cells, which are formed of the first and second gate electrode material films independently of each other;

forming a third insulating film to be buried between the respective control gate lines and between the select gate lines and the control gate lines and cover the side walls of the openings at bit line and source line contact portions; and forming second impurity-doped layers of the first conductivity type on the semiconductor layer at the bit line and source line contact portions.

BRIEF DESCRIPTION OF THE DRAWINGS

FIGS. 16A and 16B are I-I' and II-II' sectional views showing the step of stacking WSi film and oxide film.

DETAILED DESCRIPTION OF THE EMBODIMENTS

Illustrative embodiments of this invention will be explained with reference to the accompanying drawings below.

Figure 1:
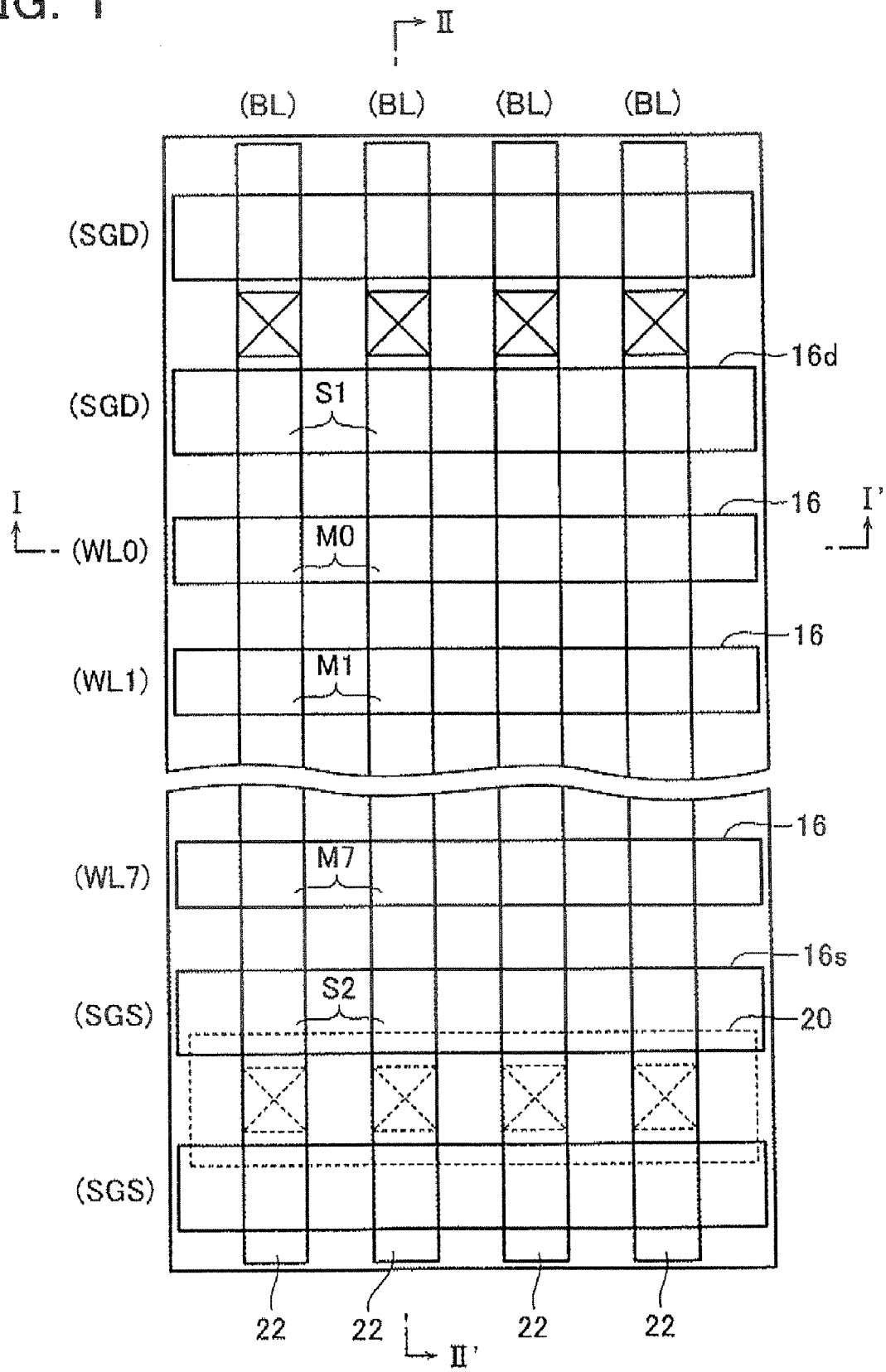
FIG. 1 is a plan view of a cell array of a NAND-type flash memory in accordance with an embodiment of the present invention.
Figure 2:
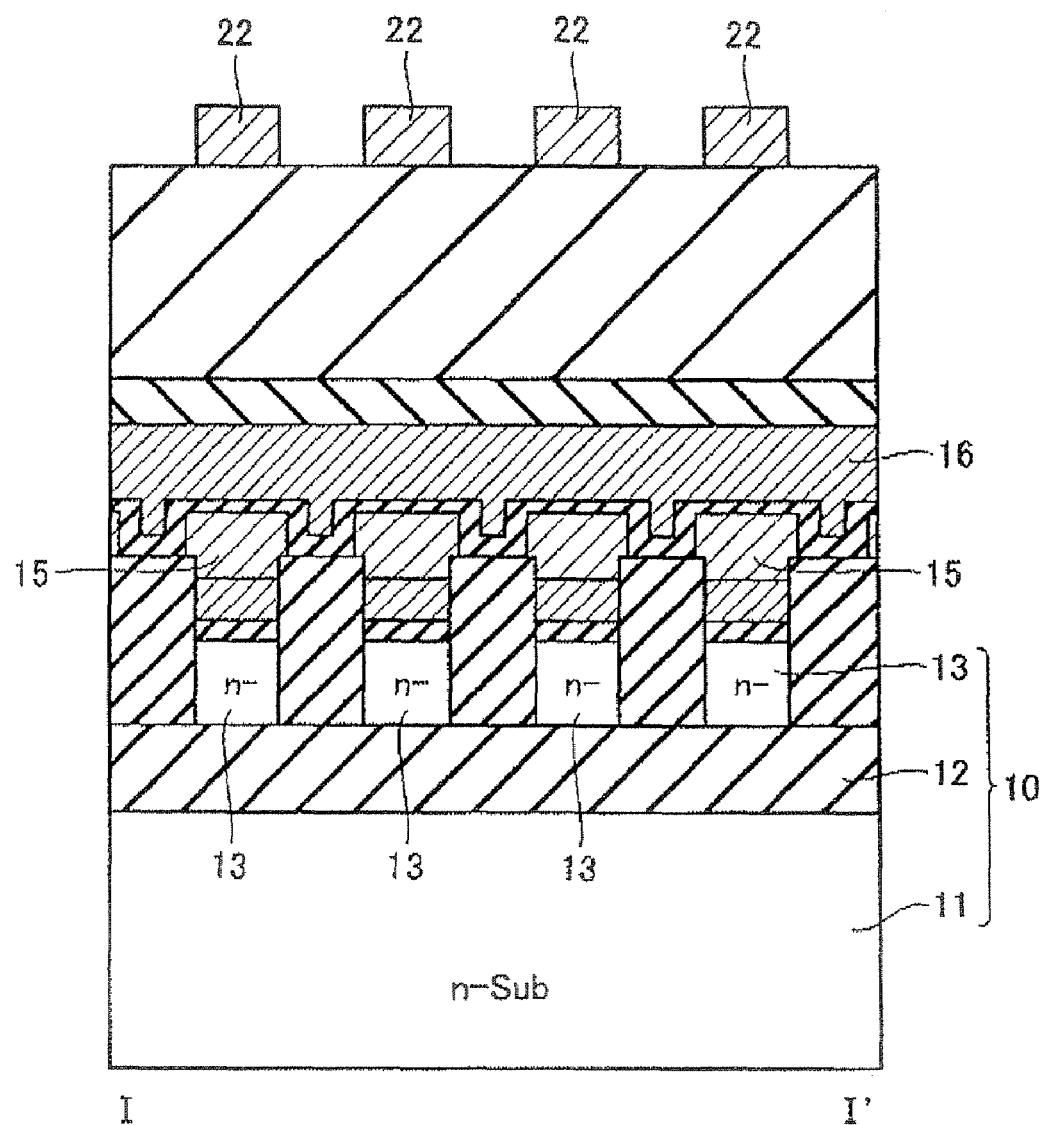
FIG. 2 is a sectional view taken along line I-I' in FIG. 1.
Figure 3:
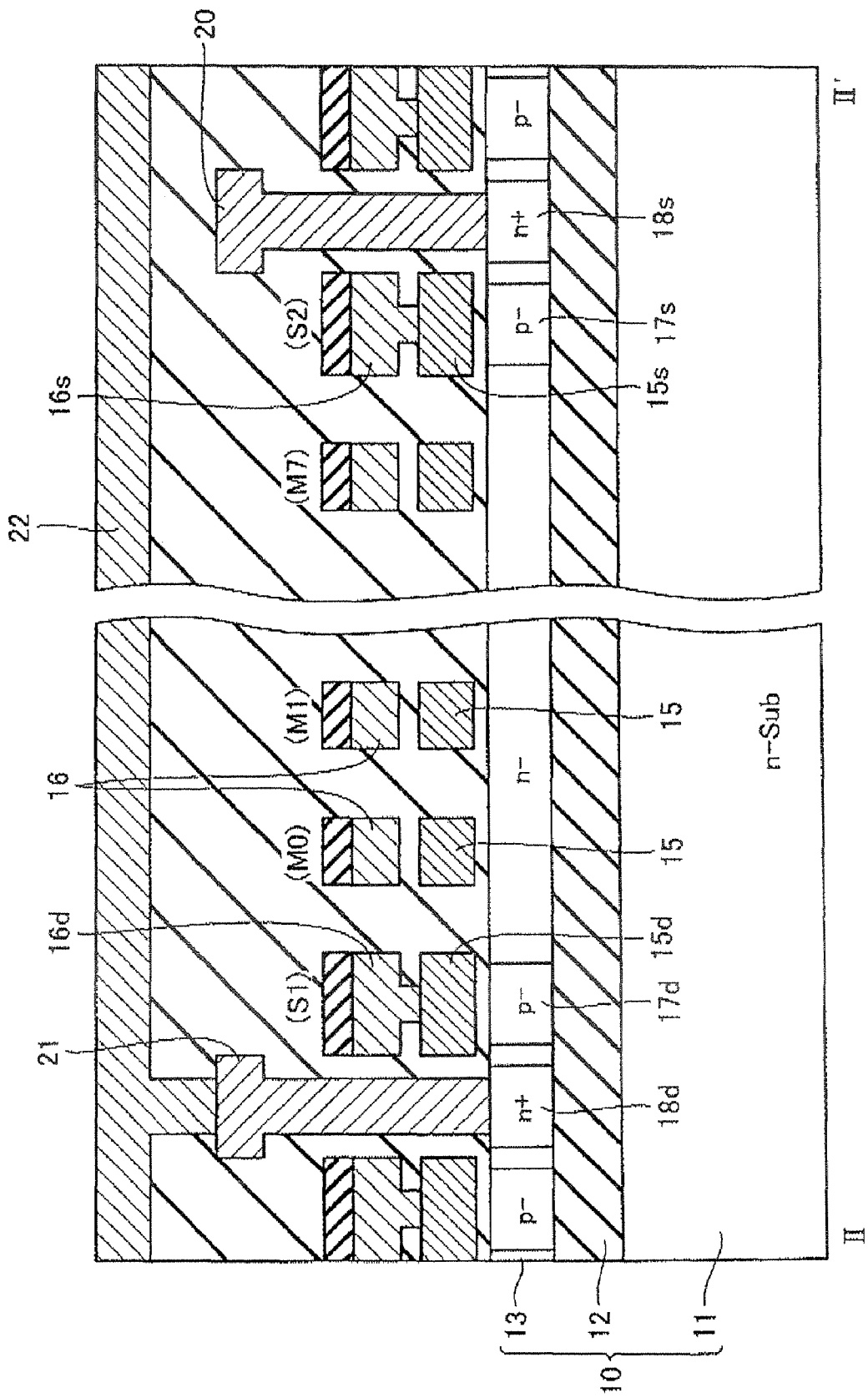
FIG. 3 is a sectional view taken along line II-II' in FIG. 1.

FIGS. 1 is a plan view of a cell array area of a NAND-type flash memory in accordance with an embodiment, and FIGS. 2 and 3 are I-I' and II-II' sectional views of FIG. 1, respectively. The cell array is formed on an SOI substrate 10, which has a silicon layer 13 formed on a silicon substrate 11 with an insulating film 12 interposed therebetween.

In this embodiment, the silicon substrate 11 has the same conductivity type as the silicon layer 13. In detail, the silicon substrate 11 is n-type while the silicon layer 13 is n⁻-type. Further in this embodiment, as described later, an advanced gate formation process is used.

Each NAND cell unit formed on the silicon layer 13 is formed of a plurality of memory cells MO-M7 connected in series and select gate transistors S1 and S2 disposed at both ends thereof. Each memory cell has a floating gate 15 and a control gate 16 stacked thereabove. The control gates 16 are patterned to be continued in one direction and serve as control gate lines (i.e., word lines) WL0-WL7.

The gates of the select gate transistors S1, S2 are formed of polycrystalline silicon films 15d, 15s and polycrystalline silicon films 16d, 16s short-circuited with each other, the former being are formed simultaneously with the floating gates 15 of the memory cells MO-M7 while the latter being formed simultaneously with the control gates 16. These polycrystalline silicon films 15d, 15s are patterned to be select gate lines SGD, SGS, which are disposed in parallel with word lines WL0-WL7.

Source and drain diffusion layers of memory cells are not formed on the silicon layer 13. That is, all of the channel regions, source and drain regions of the memory cells is n⁻-type layer as it is. Note here that p⁻-type layers 17d and 17s are selectively formed on the channel regions of the select gate transistors S1, and S2.

Coupled to the n⁺-type source diffusion layer 18s of select gate transistor S2 in the NAND cell unit is source line 20, while coupled to the n⁺-type drain diffusion layer 18d of select gate transistor S1 is bit line 22. Explaining in detail, contact plug 21 formed simultaneously with the source line 20 is in contact with the drain diffusion layer 18d, and bit line is coupled to the diffusion layer 18d via the contact plug 21.

In this embodiment, the channel regions of the select gate transistors S1 and S2, p⁻-type impurity-doped layers (i.e., diffusion layers) 17d and 17s, are formed with the following methods: (1) basically, form a resistant mask for ion-implantation on the silicon layer 13, and perform selective ion-implantation; (2) perform oblique ion-implantation via openings, which are used for forming n⁺-type impurity-doped layers (i.e., diffusion layers) 18d and 18s at the bit line and source line contact portions; or (3) perform ion-implantation via short-circuit-use openings, which are formed for short-circuiting two polycrystalline silicon layers.

Next, the method of fabricating the NAND-type flash memory in accordance with this embodiment will be explained in detail below.

Figure 4:
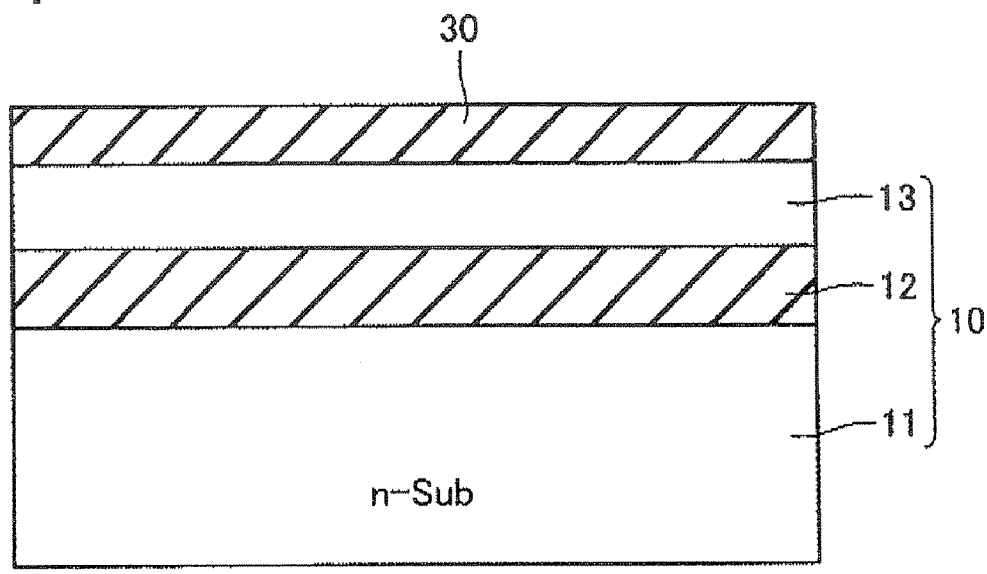
FIG. 4 shows an oxidation step for thinning the SOI layer (silicon layer) in the embodiment.
Figure 5:
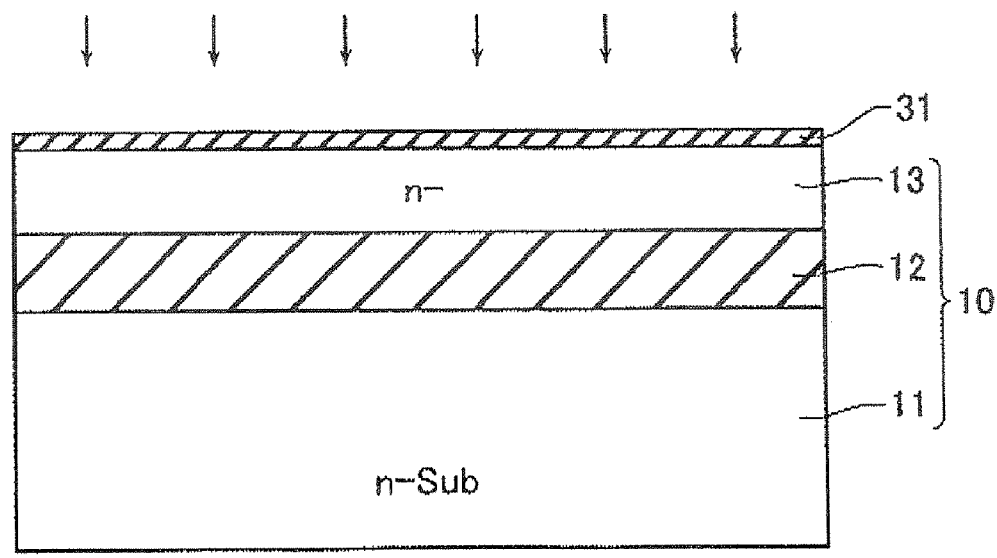
FIG. 5 shows an ion-implantation step for making the SOI layer $n^-$-type.

As shown in FIG. 4, to thin the silicon layer 13 of the SOI substrate 10 to be a certain level, form a thermal oxide film 30 on it, and then etch the oxide film 30. Thereafter, as shown in FIG. 5, form dummy oxide film 31 and perform ion implantation. As a result, the silicon layer 13 is reformed as an n⁻-type layer.

Figure 6:
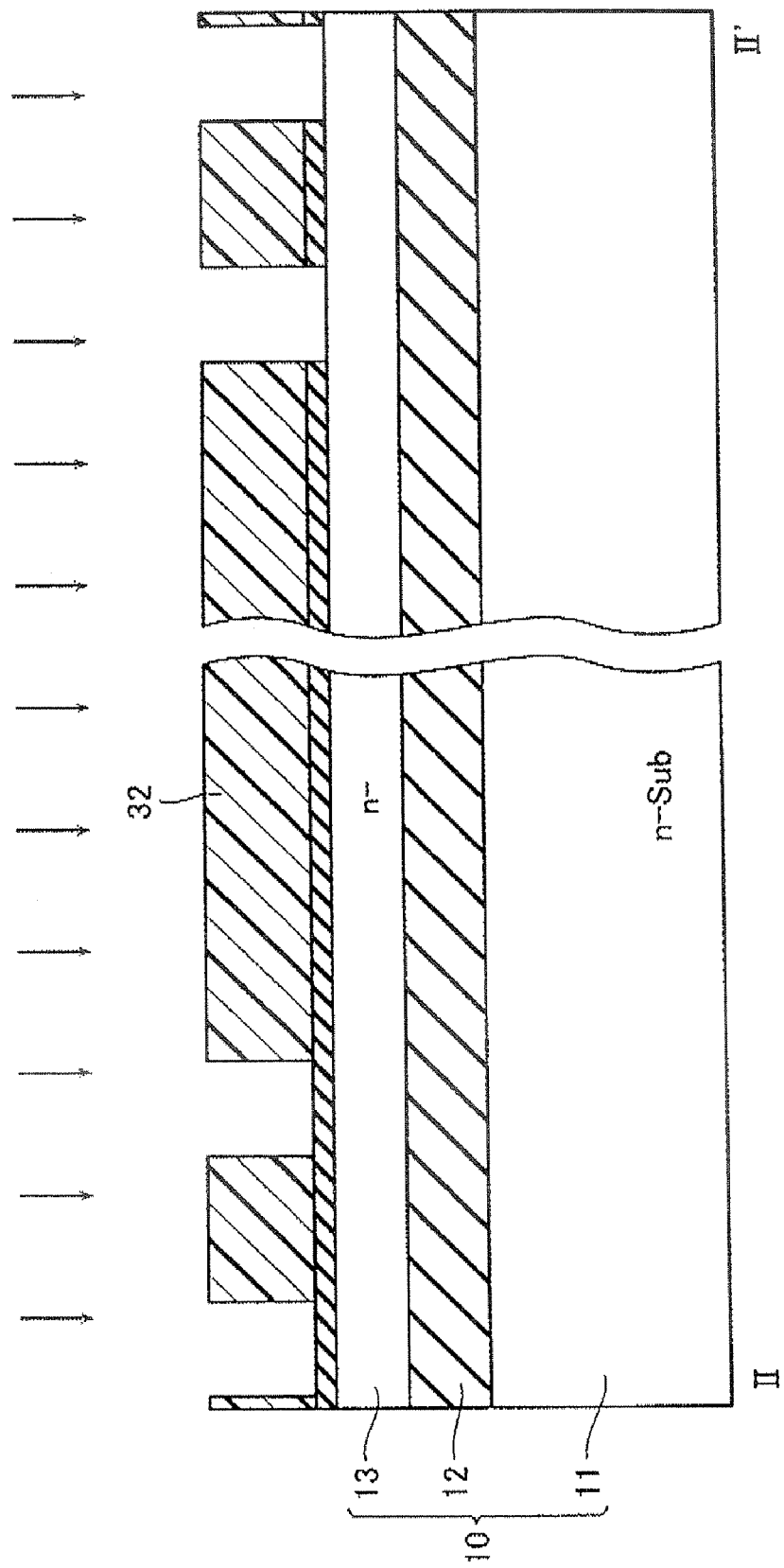
FIG. 6 is a II-II' sectional view showing an ion-implantation step for implanting ion into the channel region of the select gate transistor.
Figure 7:
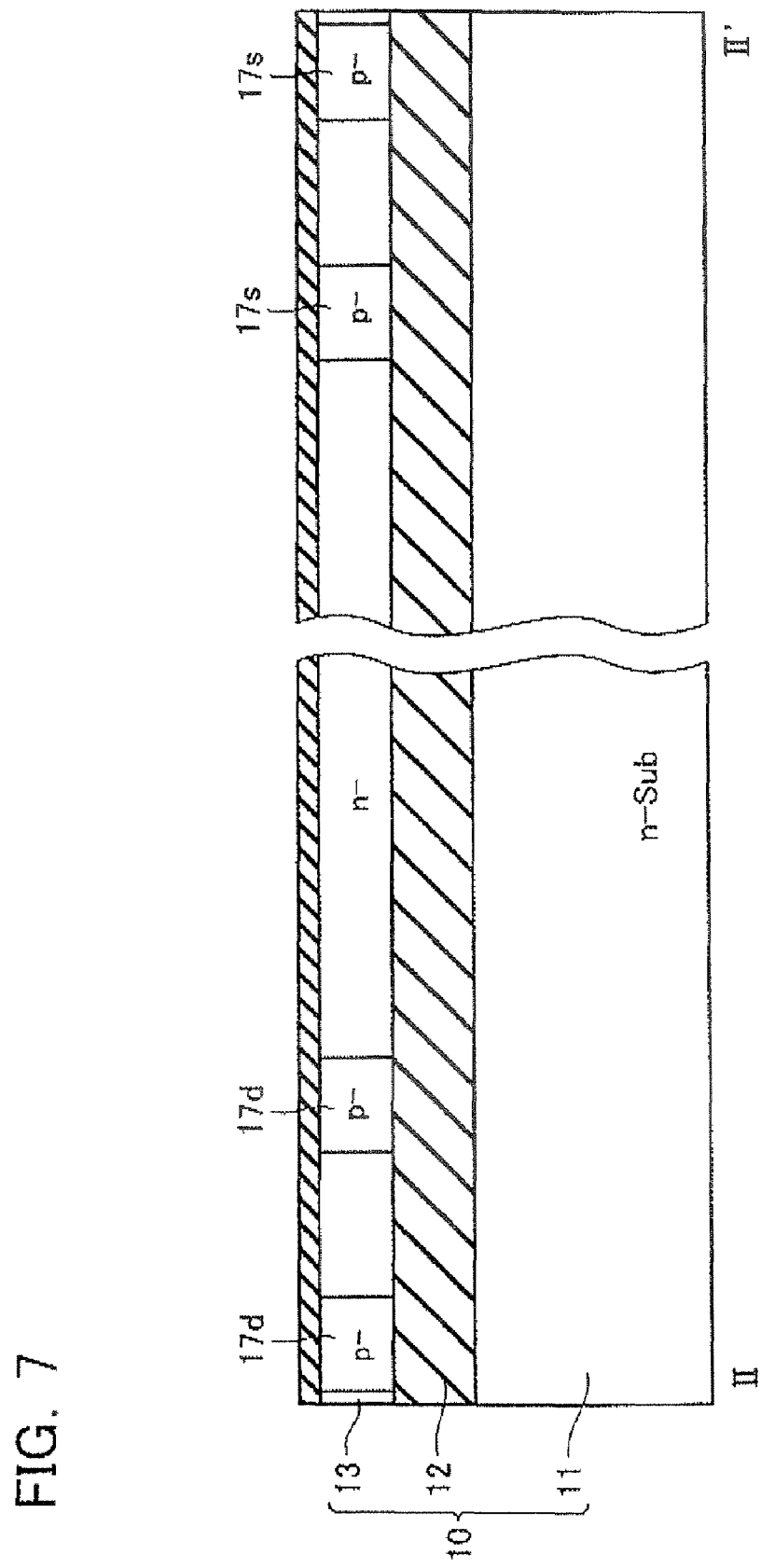
FIG. 7 is a II-II' sectional view showing the p⁻-type layer formed state at the channel region of the select gate transistor.

As shown in FIG. 6 (II-II' sectional view corresponding to FIG. 3), resistant mask 32 for ion-implantation is formed on the silicon layer to have openings at portions corresponding to the channel regions of the select gate transistors, and p-type impurities are ion-implanted. Annealing after the ion-implantation, as shown in FIG. 7, p⁻-type layers 17d and 17s are formed at the channel regions of the select gate transistors.

Figure 8:
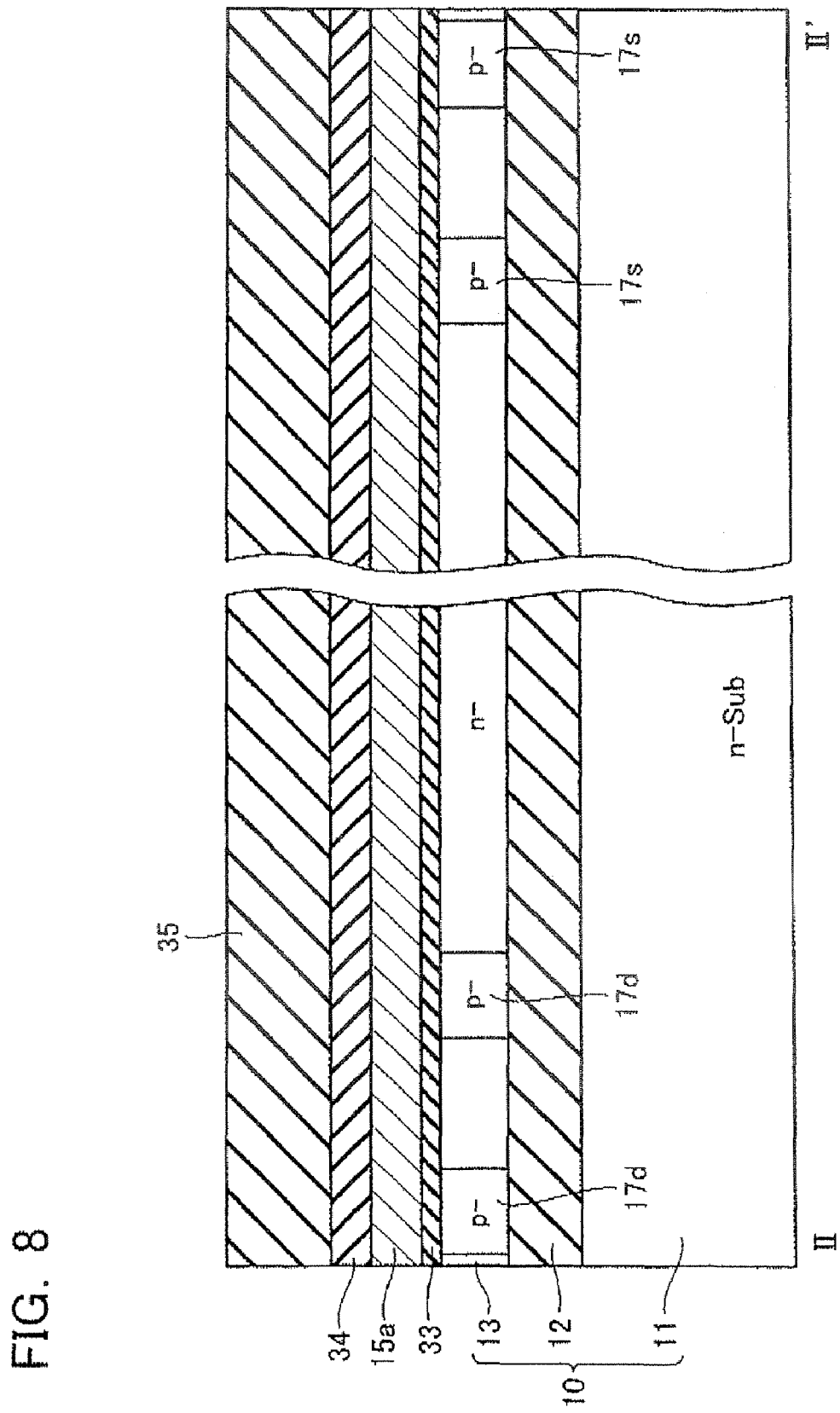
FIG. 8 is a II-II' sectional view showing steps of sequentially forming floating gate-use first polysilicon film, silicon nitride film and oxide film after having formed tunnel insulating film.

After having removed the dummy oxide film 31., as shown in FIG. 8, form gate insulating film (tunnel dielectric film) 33 on the silicon layer 13, and form thereon a first polycrystalline silicon film 15a, which serves as a gate electrode material film used for floating gates. Further, sequentially stacked on the first polycrystalline silicon film 15a are silicon nitride film 34 and silicon oxide film 35 formed by TEOS-CVD (i.e., TEOS oxide film).

Figure 9:
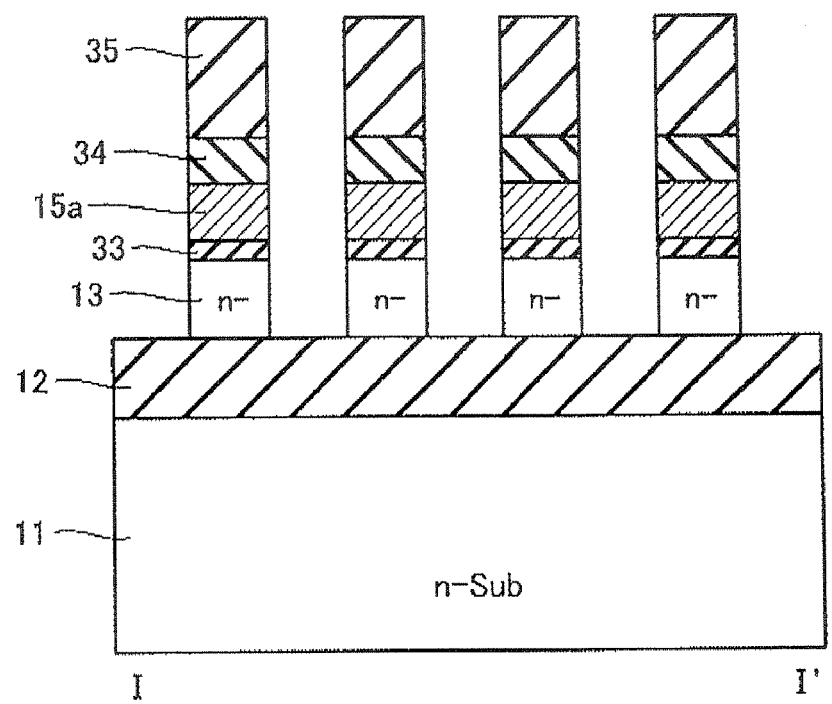
FIG. 9 is a I-I' sectional view showing silicon etching and device isolating.

Next, as shown in FIG. 9 (I-I' sectional view corresponding to FIG. 2), etch the oxide film 35 and silicon nitride film 34 by RIE to have stripe-shaped patterns. Subsequently, etch the polycrystalline silicon film 15a, tunnel insulating film 33 and silicon layer 13 by RIE by use of the oxide film and nitride film as masks. As a result, device formation areas are defined as stripe-shaped silicon layers 13, which are separated from each other.

Figure 10:
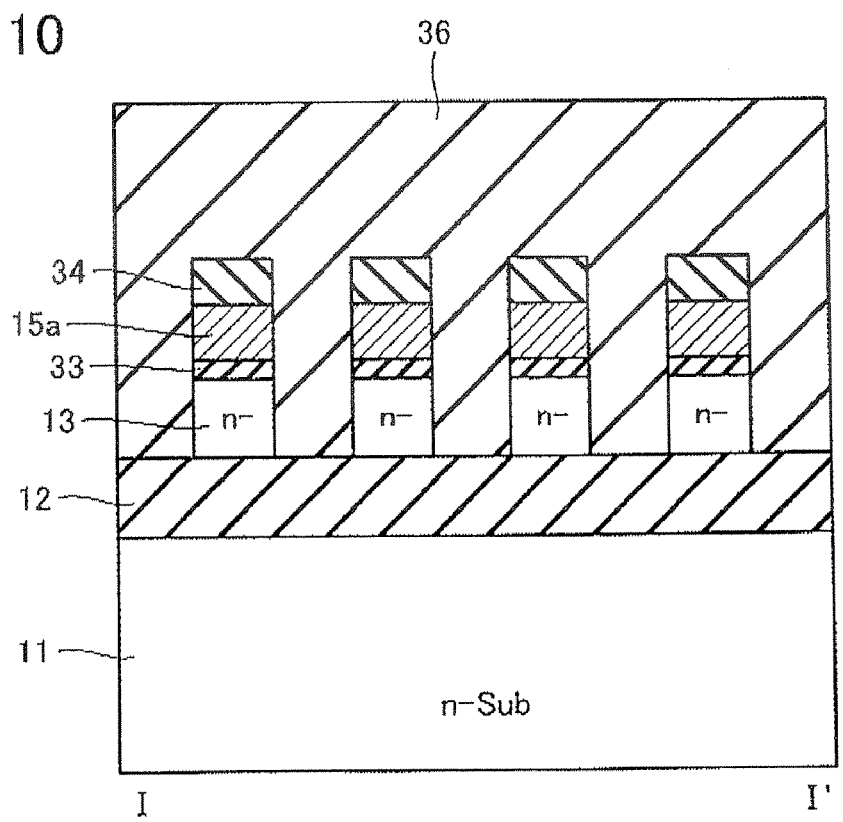
FIG. 10 is a I-I' sectional view showing the device isolating film formation process.

Next, as shown in FIG. 10, oxide film 36 formed by high density plasma CVD (i.e., HDP oxide film) is buried between the device formation areas as a device isolating dielectric film.

Figure 11A:
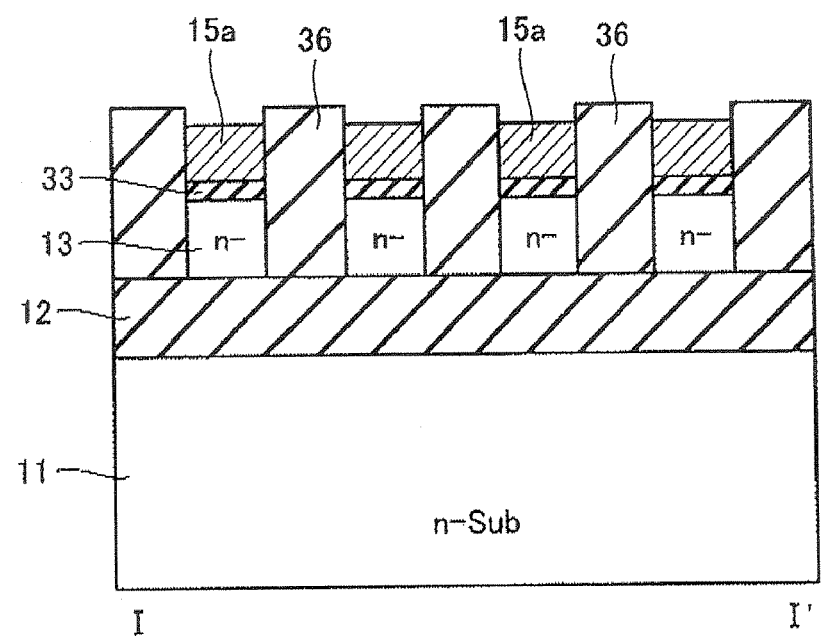
FIGS. 11A and 11B are I-I' and II-II' sectional views showing the device isolating film etching for exposing the polysilicon film.
Figure 11B:
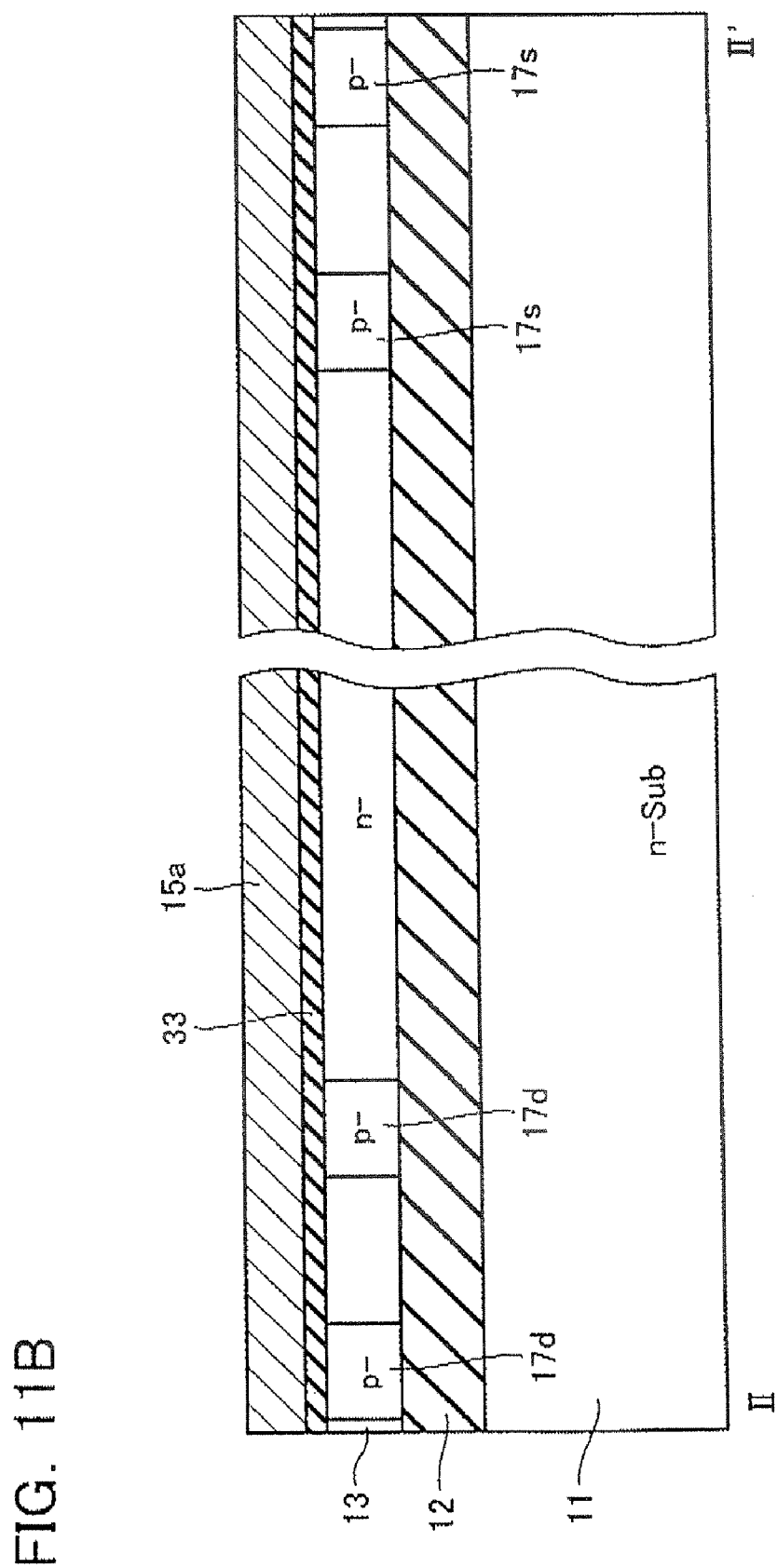

Then, perform CMP (Chemical Mechanical Polishing) process for the oxide film 36, and remove the exposed silicon nitride film 34. As a result, there is provided such a state that shown in FIG. 11A (I-I' sectional view) and FIG. 11B (II-II' sectional view). That is, each stripe-shaped silicon layer 13 serving as a device formation area is in such a state that three surfaces thereof are covered by isolating films.

Figure 12A:
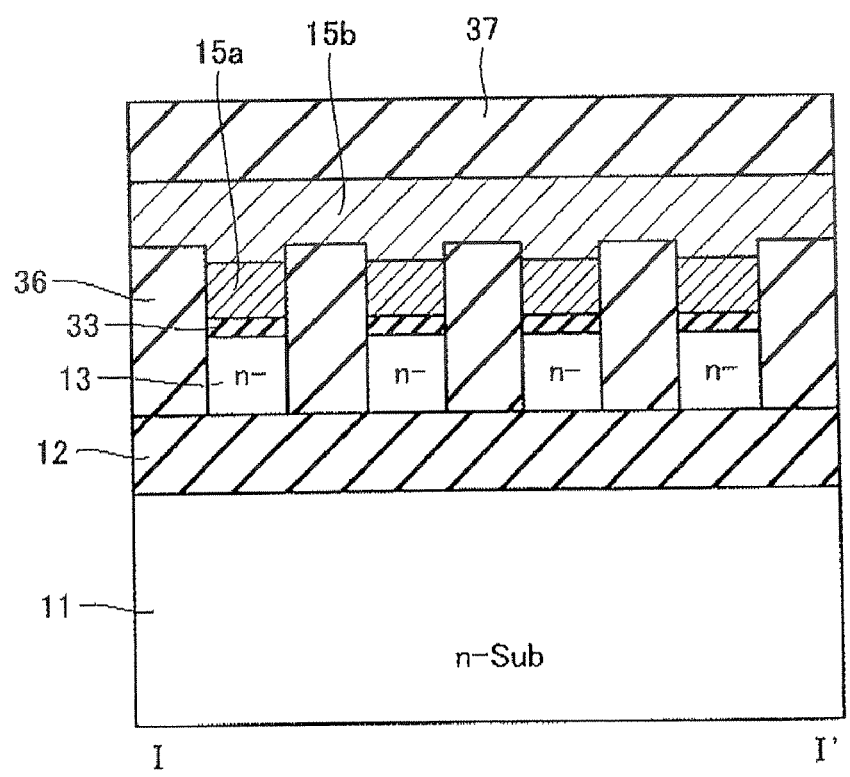
FIGS. 12A and 12B are I-I' and II-II' sectional views showing the process of stacking the second polysilicon film and oxide film.
Figure 12B:
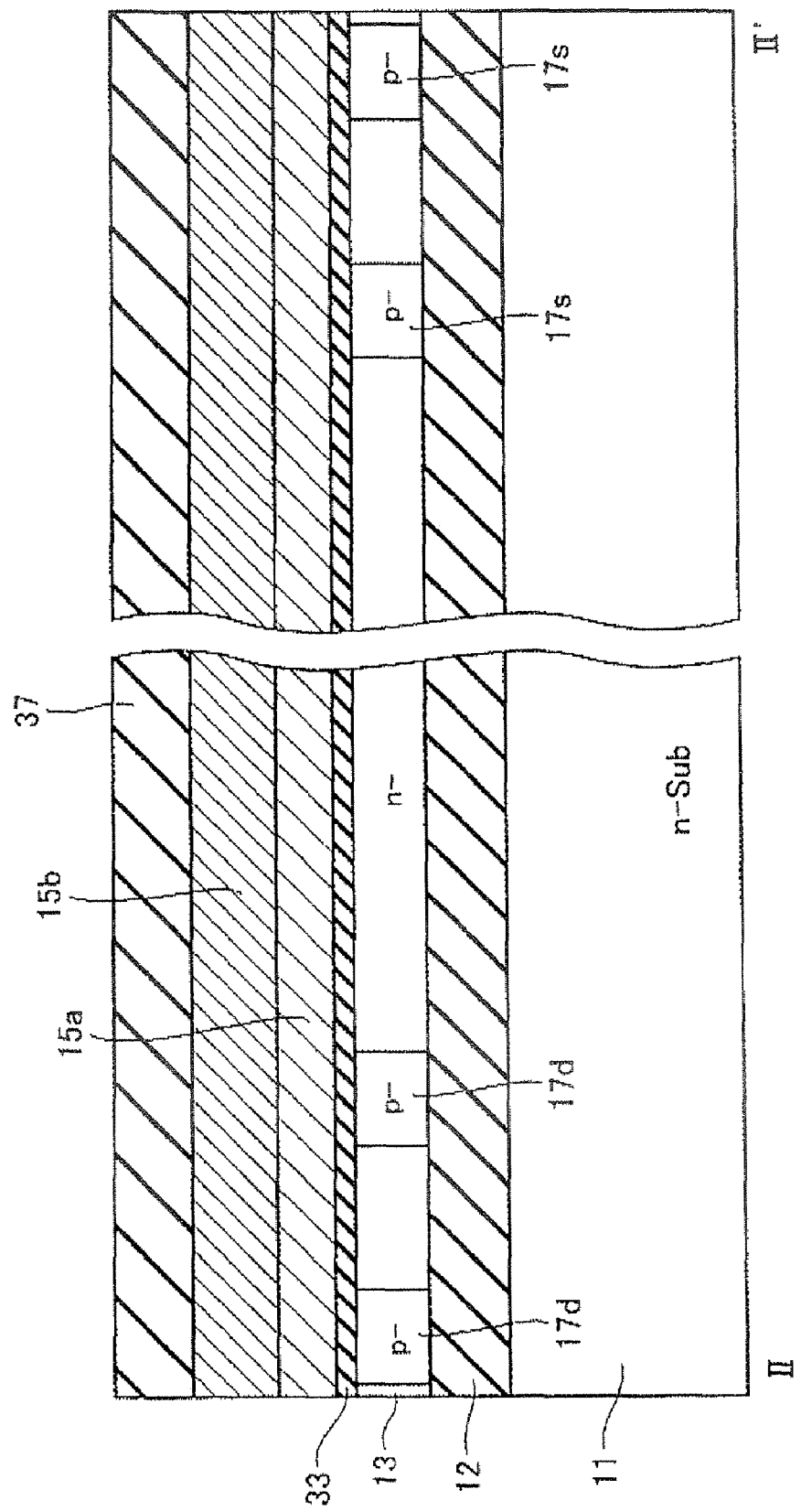

Next, as shown in FIGS. 12A and 12B, second polycrystalline silicon film 15b, which serves as floating gates together with the first polycrystalline silicon film 15a, is formed, and TEOS oxide film 37 is formed thereon.

Figure 13:
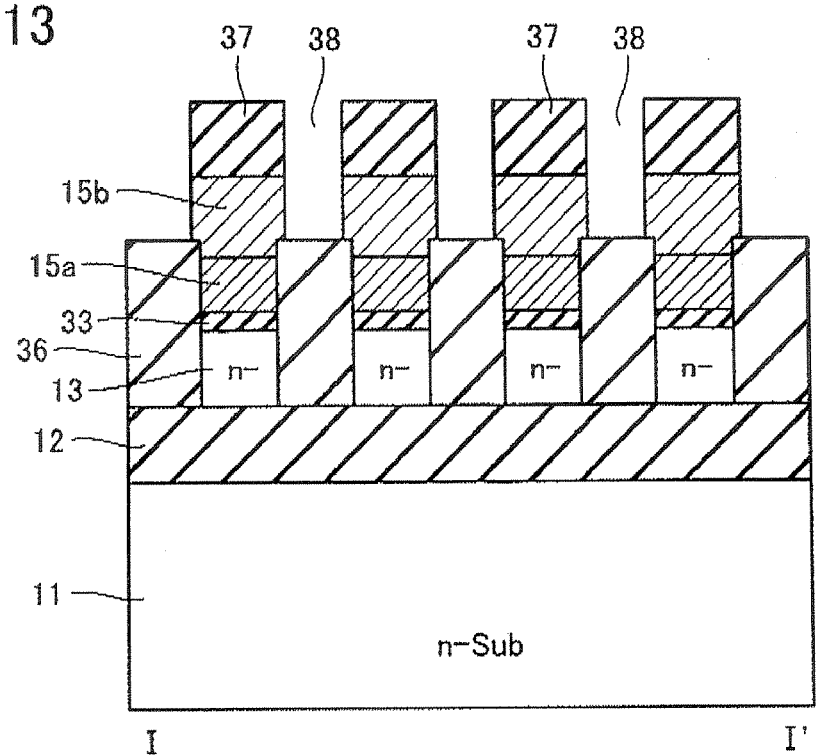
FIG. 13 is a I-I' sectional view showing the second polysilicon etching for forming grooves used for separating the floating gates in the word line direction.

As shown in FIG. 13, etch the TEOS oxide film 37 to form grooves 38 for separating the floating gates in the word line direction, and further etch the exposed portion of the second polysilicon film 15b.

Figure 14A:
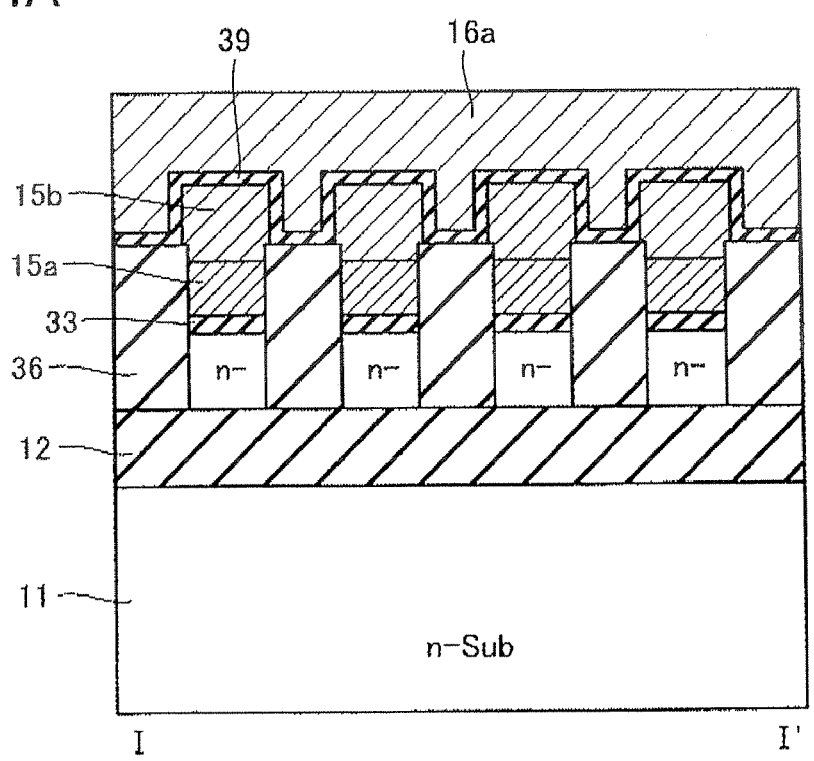
FIGS. 14A and 14B are I-I' and II-II' sectional views showing the formation step of the third polysilicon film serving as control gates.
Figure 14B:
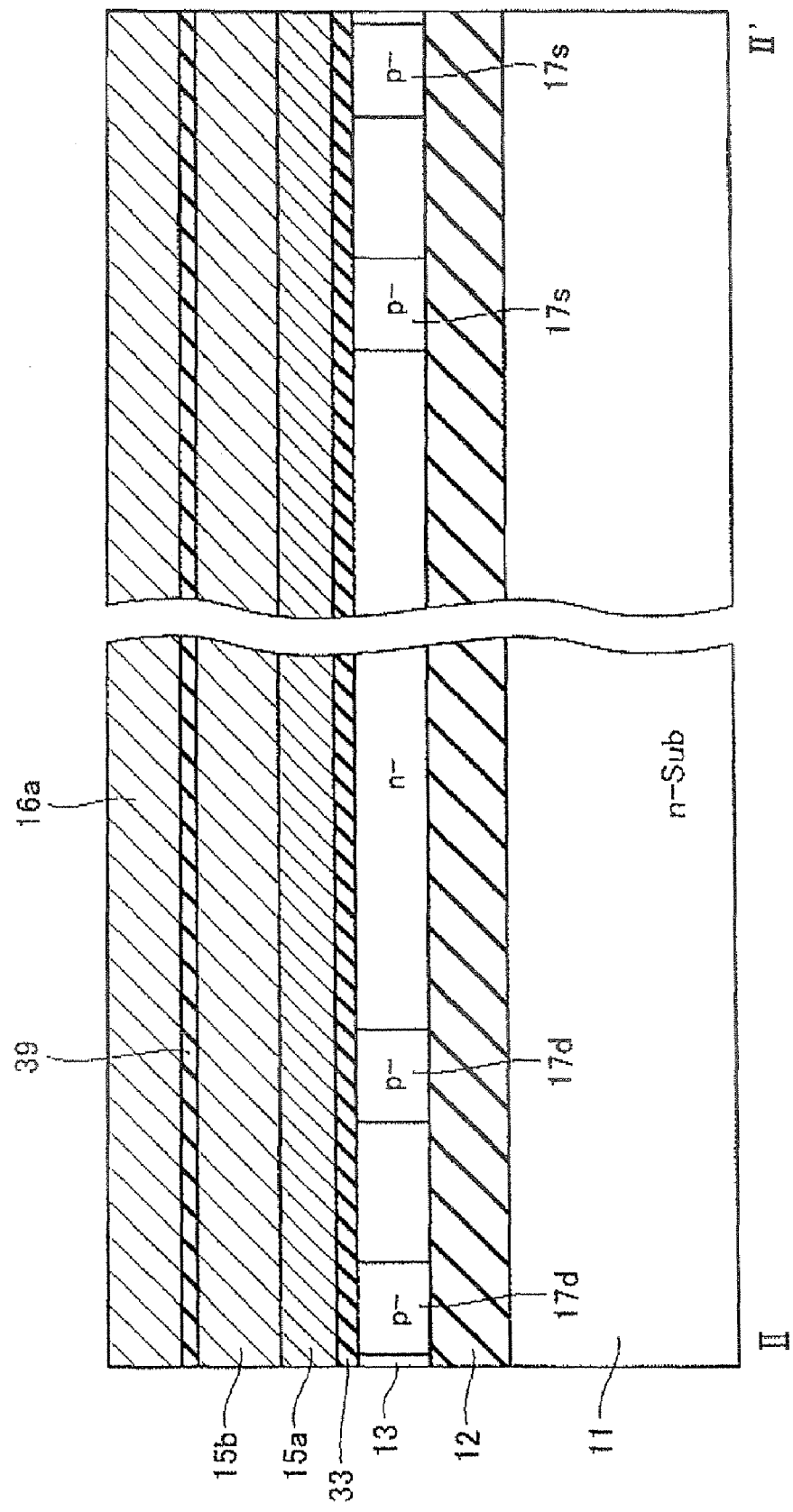

Following it, as shown in FIGS. 14A and 14B, high dielectric coefficient insulating film (high-k film) is formed as intergate dielectric film 39, and formed thereon is third polycrystalline silicon film 16a, which is to be patterned as control gates serving as word lines.

Figure 15:
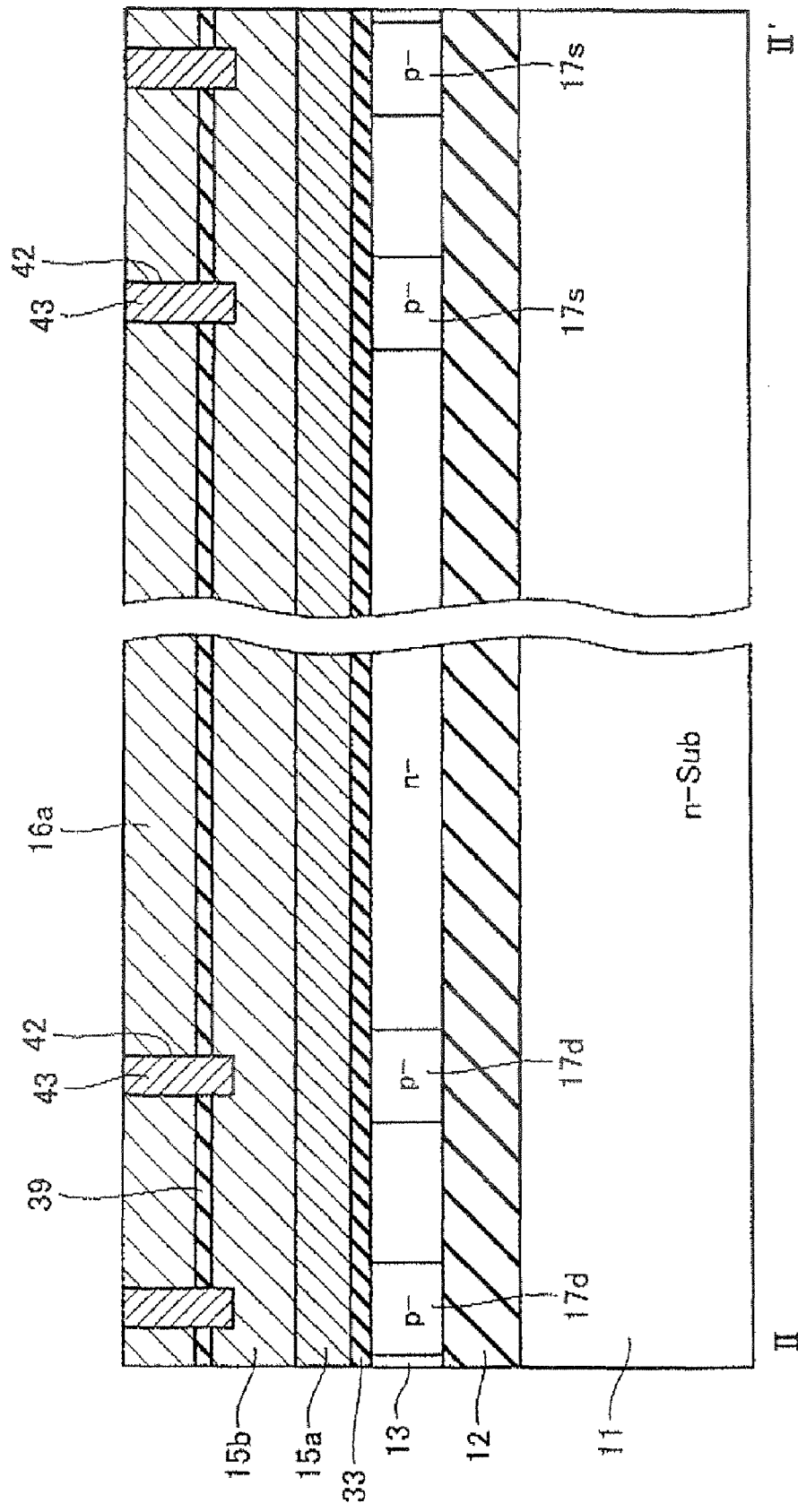
FIG. 15 is a II-II' sectional view showing the step of short-circuiting the gate of the select gate transistor.

Next, as shown in FIG. 15, in order to short-circuit the first, second and third polysilicon films 15a, 15b and 16a to form gates of the select gate transistors, short-circuit-use openings 42 are formed at the select gate transistors in such manner that they penetrate the third polysilicon film 16a to reach the second polysilicon film 15b. The openings 42 are buried with polycrystalline silicon film 43.

Figure 16A:
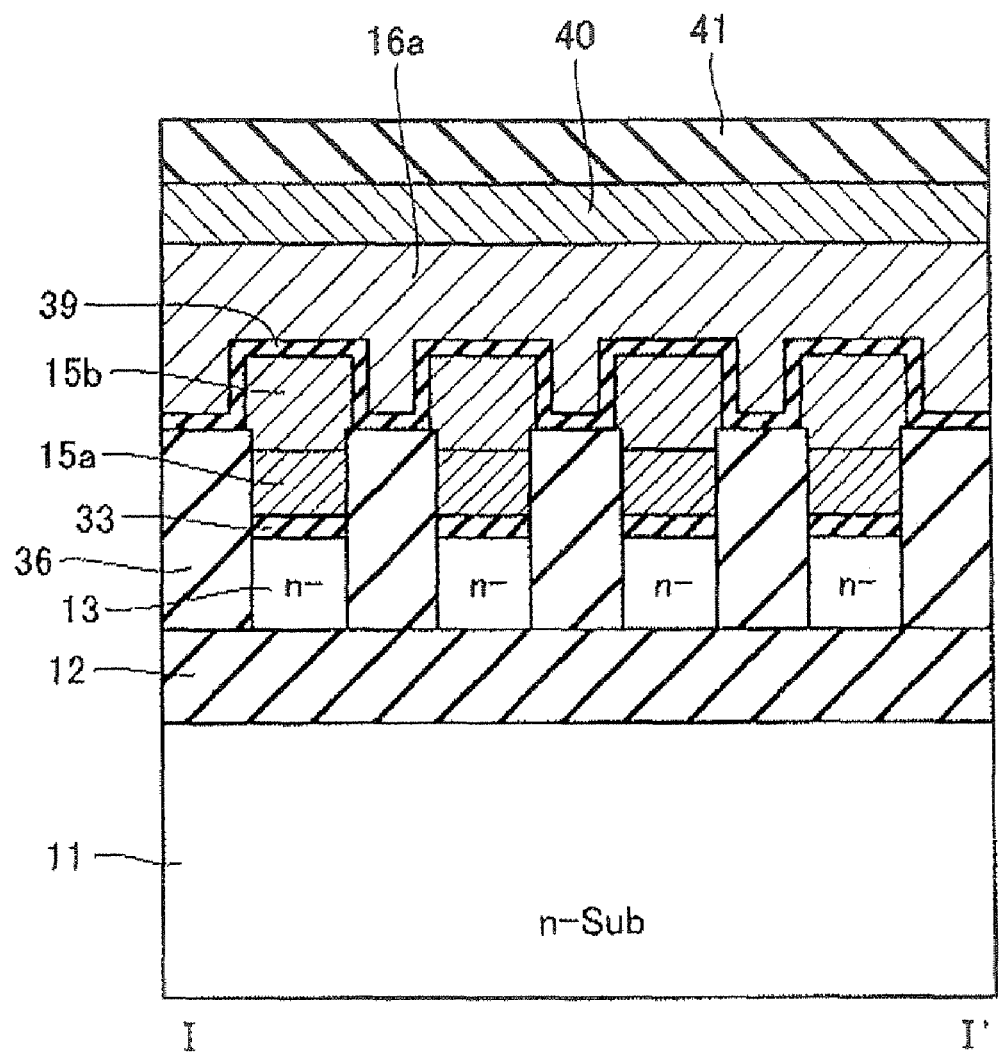

Following it, as shown in FIGS. 16A and 16B, WSi film 40 is formed for the purpose of making the resistance of word lines and select gate lines low, and silicon nitride film 41 is formed thereon.

Figure 17:
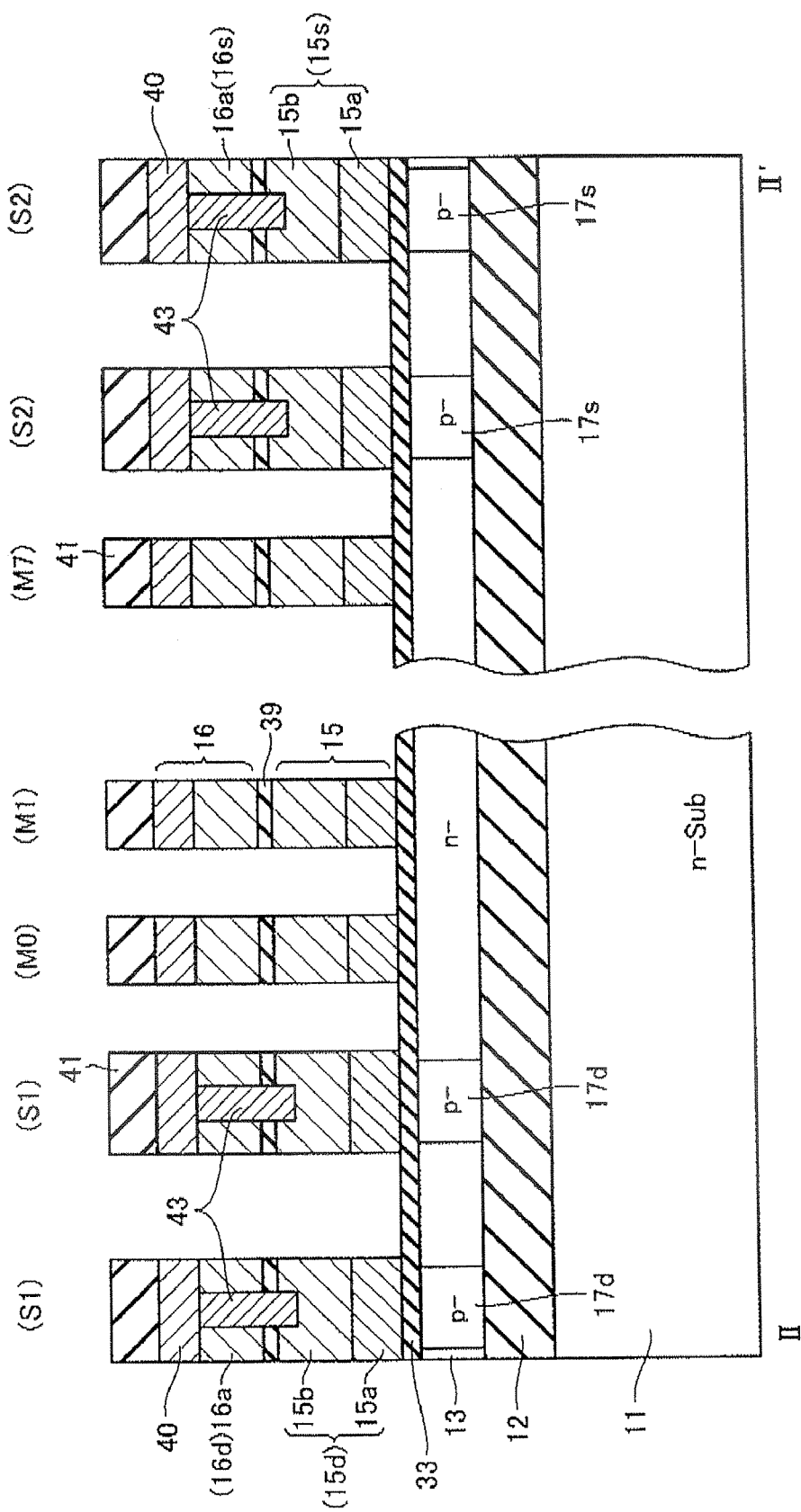
FIG. 17 is a II-II' sectional view showing the steps of patterning word lines and select gate lines, and separating the is floating gates.

As shown in FIG. 17, the silicon nitride film 41 is etched to become mask patterns for forming word lines and select gate lines With these mask patterns, etching from WSi film 40 to first polysilicon film 15a, floating gates 15 isolated from each other for every memory cell and control gates (word lines) 16 stacked thereabove are formed. At the select gate transistor portions, conductive layers from the first polysilicon film 15a to WSi film 40 are patterned to be select gate lines (15d, 16d), (15s, 16s), which run in parallel with word lines.

According to the above-described processes, memory cell units are formed, each of which includes memory cells M0-M7 and select gate transistors S1 and S2. Source and drain diffusion layers of memory cells are not formed, n⁻-type silicon layer 13 serves as channel regions, source and drain regions of memory cells as it is.

Figure 18:
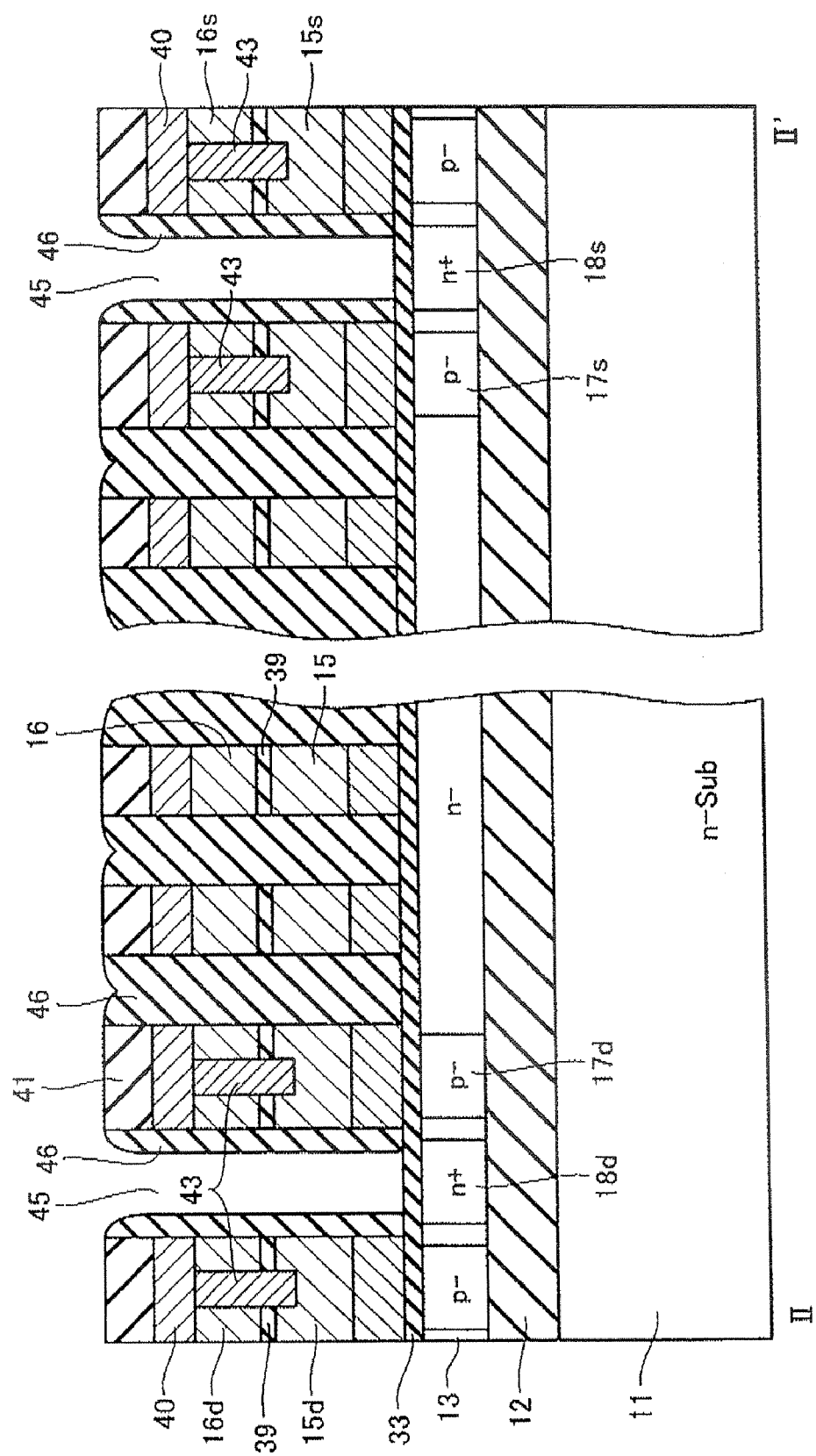
FIG. 18 is a II-II' sectional view showing the steps of forming the insulating film for separating cells, forming contact openings, and forming n⁺-type diffusion layers.

Next, as shown in FIG. 18, form an insulating film, e.g., TEOS oxide film 46, to be buried between memory cells and select gate transistors, i.e., between word lines and between select gate lines and word lines. Etching this oxide film 46, sidewalls of the openings at the source and drain regions of the select gate transistors S1 and S2 (i.e., bit line contact and source line contact portions) may be covered with the oxide film 46 in such a way as to cover the exposed side walls of the select gate lines. Performing ion-implantation in this state, bit line contact- and source line contact-use n⁺-type diffusion layers 18d and 18s are formed.

Then, as shown in FIGS. 2 and 3, after having formed the interlayer dielectric film and contact holes therein, source line 20 and bit line contact plug 21 are formed with a polycrystalline silicon film. Source line 20 is formed as a common source line, which couple in common multiple n⁺-type layers 18s. Further, after having formed another interlayer dielectric film and contact holes therein, bit line 22 is formed with a metal film.

According to this embodiment, as a result of that an SOI substrate is used, there is provided such a NAND-type flash memory that the breakdown voltage is high in spite of cell' miniaturization; and the capacitance between cells is small, Suitably setting the thickness of the SOI layer (n⁻-silicon layer 13), the SOI layer may be used as channel, source and drain regions as it is, and it is possible to achieve a desired memory property.

Further, according to this embodiment, the memory fabrication process will be simplified because there is no need of: forming source, drain diffusion layers; channel ion implantation; and extension forming process, which are necessary for normal bulk-type flash memories.

Additionally, since SOI substrate 10 has n-type silicon substrate 11 and n⁻-type silicon layer 13 formed thereabove, it will be obtained advantageous effects as follows. First, when n-type impurities are ion-implanted into the silicon substrate 11, they are implanted simultaneously into the silicon layer 13. Therefore, it is no need of performing channel ion-implantation. Secondary, if p-type substrate is used, when word lines are applied with a negative voltage, there is a fear of depleting the substrate. In case the n-type substrate is used, there is not any fear of depleting the substrate.

With respect to the select gate transistors, p⁻-type layers 17d and 17s are formed at the channel regions so that the transistors are off with 0V gate voltage. This structure may be formed with a simple process. Further, it is possible to form the n⁺-type diffusion layers 18d and 18s at the bit line and source line contact portions without affecting the memory property in such a way that ion-implantation is performed via openings formed at the contact portions after burying the insulating film between memory cells.

With respect to the channel regions 17d and 17s of the select gate transistors, in addition to the selective ion-implantation method explained with reference to FIG. 6, it is possible to use other methods as follows.

Figure 19:
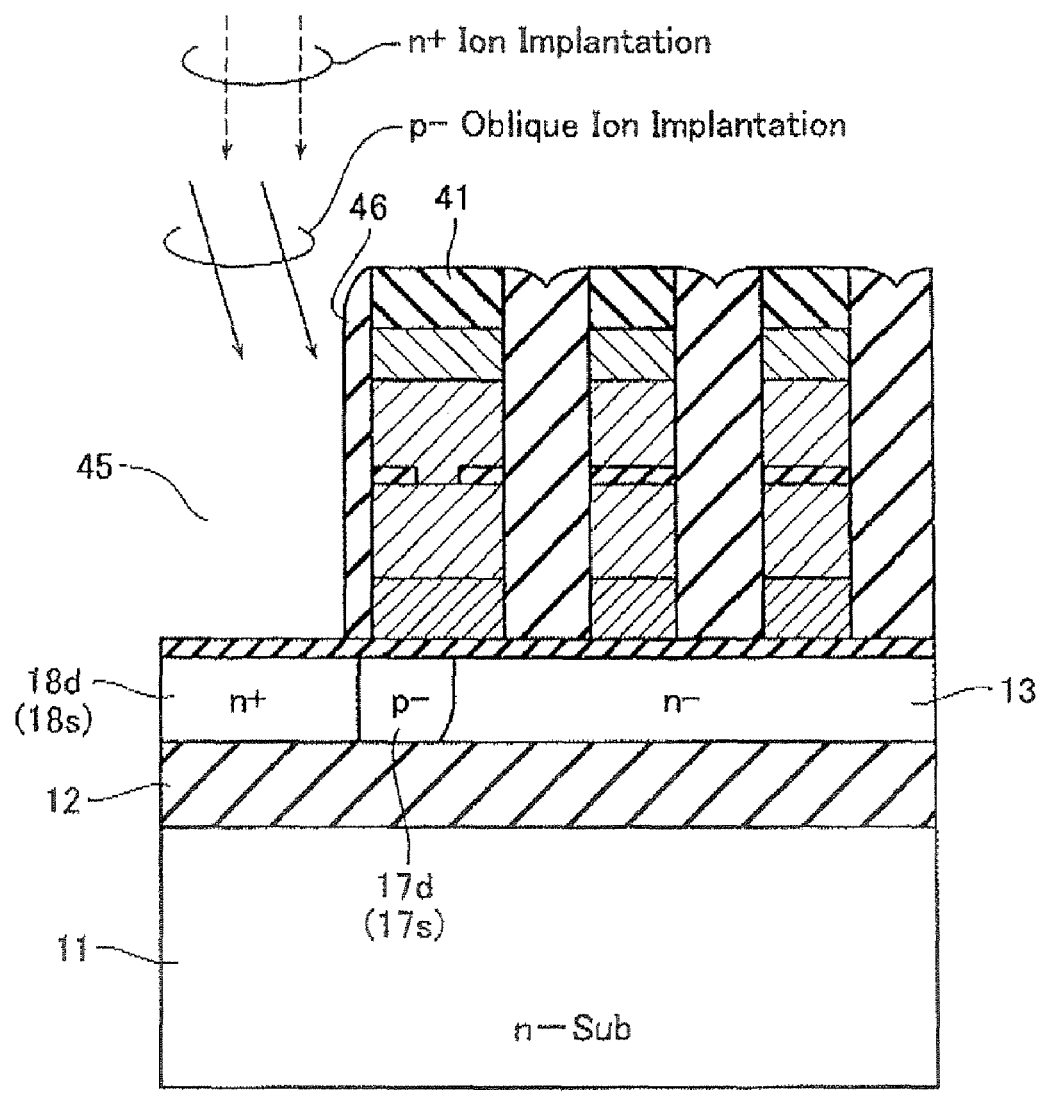
FIG. 19 is a sectional view showing another method of forming p⁻-type layers of the select gate transistors.

As shown in FIG. 19, before or after the ion-implantation for forming n⁺-type diffusion layers 18d and 18s via openings, i.e., contact holes 45, at the bit line and source line contact portions, perform oblique ion-implantation of p-type impurities via the same contact holes 45. As a result, p⁻-type layers 17d and 17s may be formed at the channel region of the select gate transistors.

Figure 20:
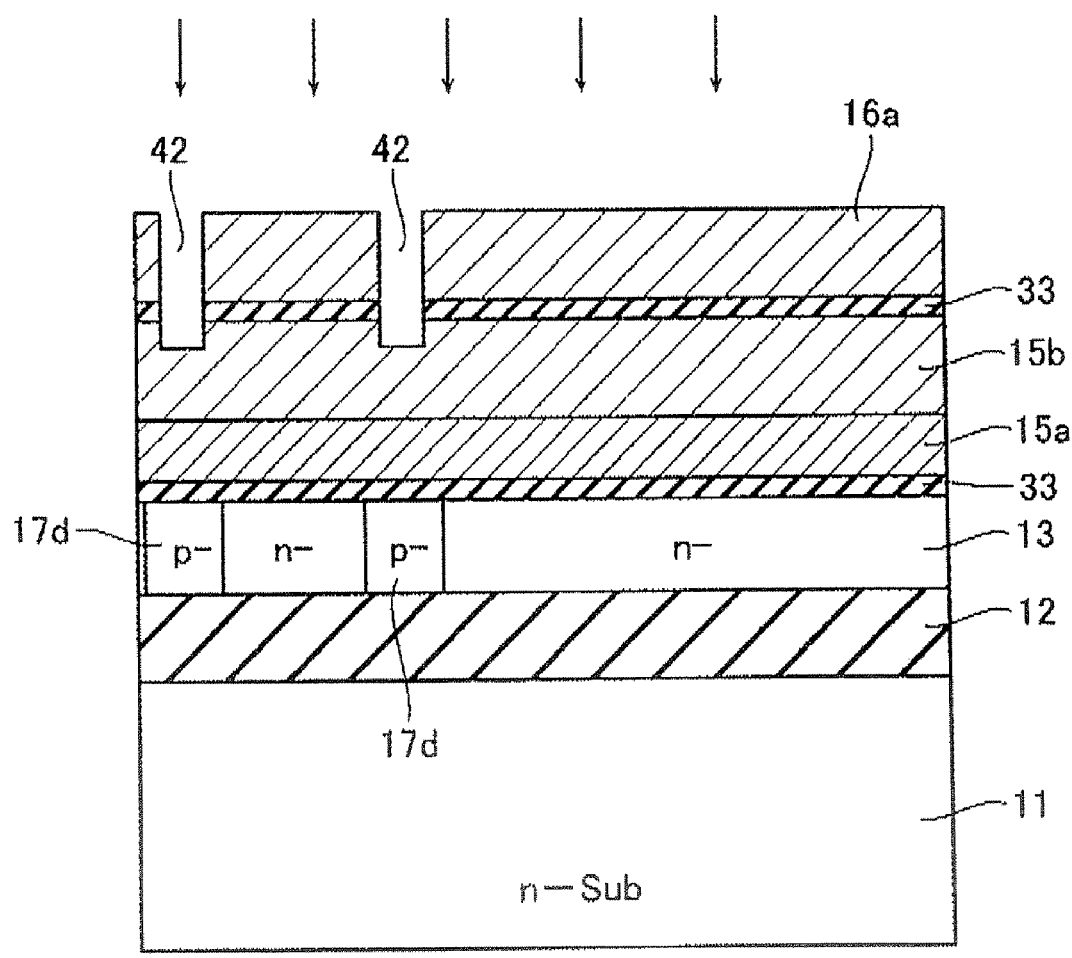
FIG. 20 is a sectional view showing still another method of forming p⁻-type layers of the select gate transistors.

FIG. 20 shows another method, which uses the short-circuit openings 42 for short-circuiting the second and third polycrystalline silicon films to form gate electrodes of the select gate transistors. That is, p-type impurity ion-implantation is performed via the short-circuit openings 42, which are formed to penetrate the third polysilicon film 16a to reach the second polysilicon film 15b, and via the first polysilicon film 15a, whereby the p⁻-type layers 17d and 17s may be formed at the channel region of the select gate transistors.

Using these methods shown in FIGS. 19 and 20, it becomes unnecessary for using any special mask process, and the process numbers will be reduced.

Figure 21:
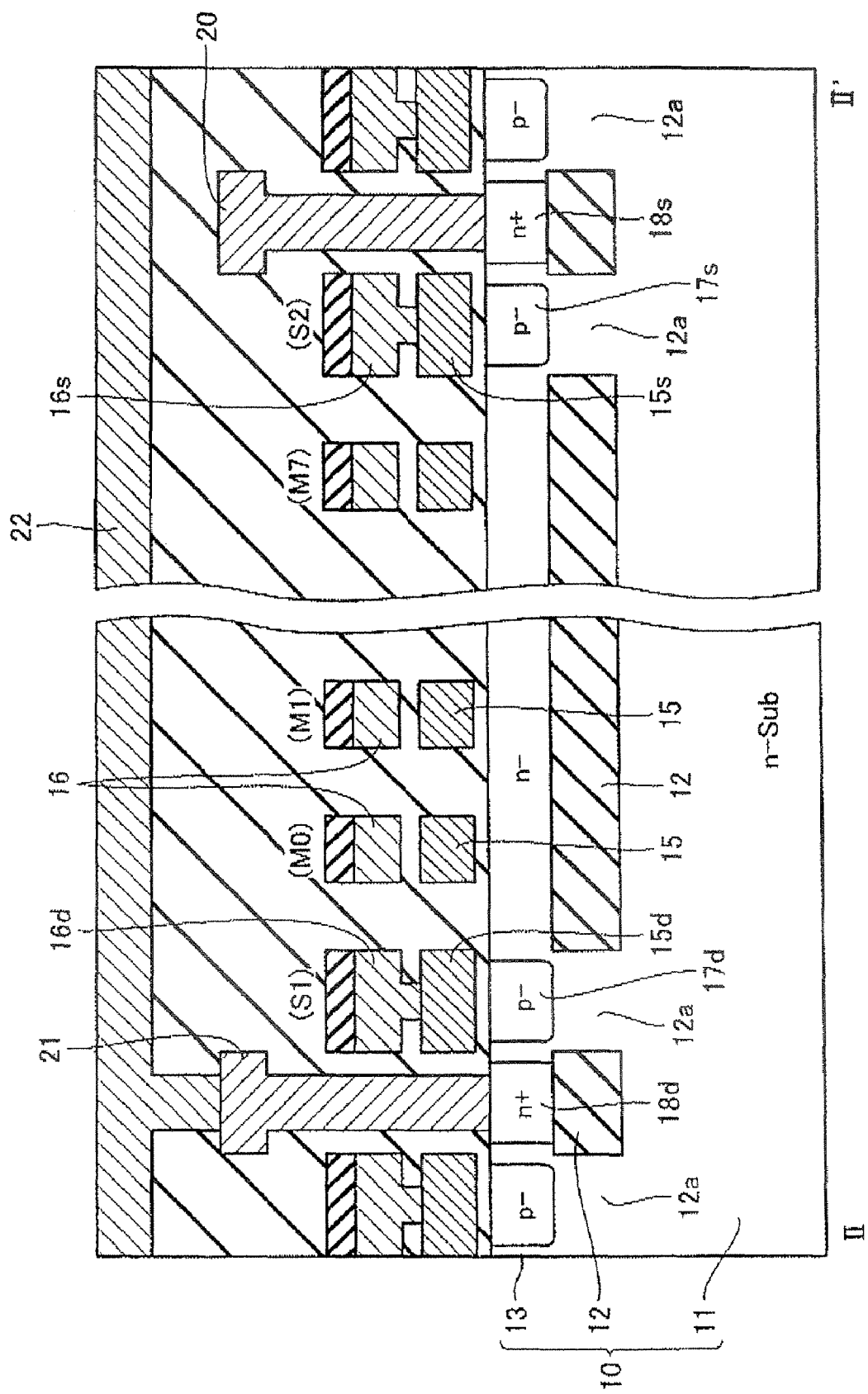
FIG. 21 is a II-II' sectional view of a cell array in accordance with another embodiment, which corresponds FIG. 3.

FIG. 21 shows a cell array in accordance with another embodiment, which corresponds to that shown in FIG. 3. In this embodiment, as the SOI substrate 10, it is used such a partial SOI substrate that openings 12a are formed in the separating dielectric film 12, and silicon layer 13 is in contact with the substrate 11 via these openings 12a. Otherwise, it is the same as the above-described embodiment.

Although, in the example shown in FIG. 21, the openings 12a in the insulating film 12 are located at the select gate transistors S1 and S2, other suitable positions may be selected. This partial SOI substrate is formed, for example, as follows. After having formed the openings 12a in the insulating film 12 on the substrate 11, an amorphous silicon layer or a polycrystalline silicon layer is deposited thereon. Then, annealing for crystallizing it, the silicon layer 13 is recrystallized or crystallized from the substrate 11 based on solid-phase epitaxial growth via the openings 12a. As a result, it is possible to obtain a cheep SOI substrate with a good quality.

It has already been confirmed that by use of the above described partial SOI substrate, a flash memory is obtained with good erase, read and write properties.

Next, some embodiments taking note of peripheral circuits in the flash memory will be explained below.

Figure 22:
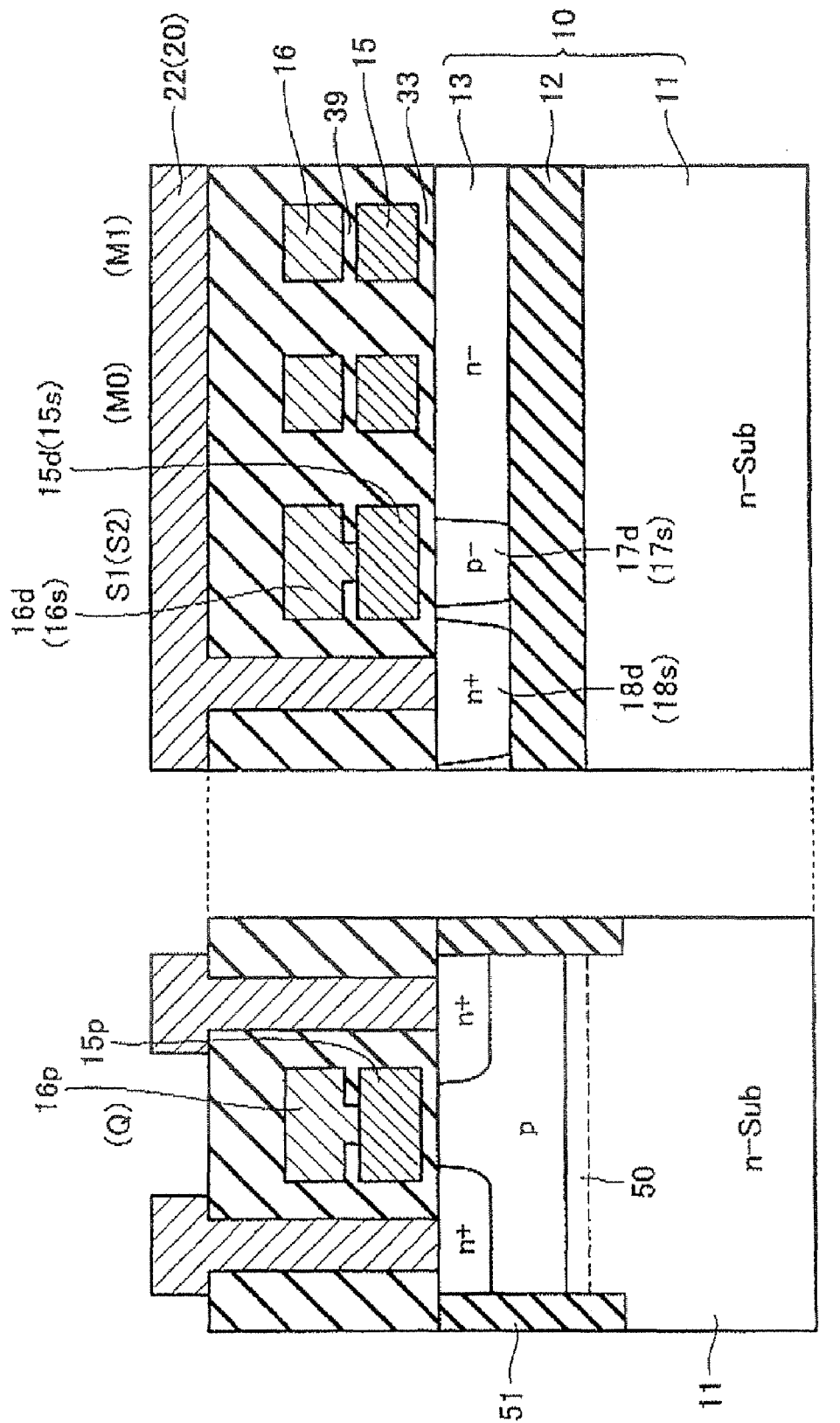
FIG. 22 is a sectional view for explaining another embodiment which takes note of the peripheral circuit.

FIG. 22 is an example, in which silicon layer 13 and insulating film 12 are removed and a silicon layer 50 is formed by selective epitaxial growth at the peripheral circuit area of the SOI substrate 10. A peripheral transistor Q is formed in an area surrounded by a device isolating dielectric film 51 buried with an STI (Shallow Trench Isolation) technique.

The gate structure of the peripheral transistor Q is the same as the select gate transistors S1 and S2 in the cell array. That is, the gate of the transistor Q is formed of polycrystalline films 15p and 16p, which are identical with the polycrystalline films 15d (15s) and 16d (16s) used in the select gate transistor S1(S2). With the above-described structure, making the cell array and the peripheral circuit share the forming process, the number of processes will be reduced.

Figure 23:
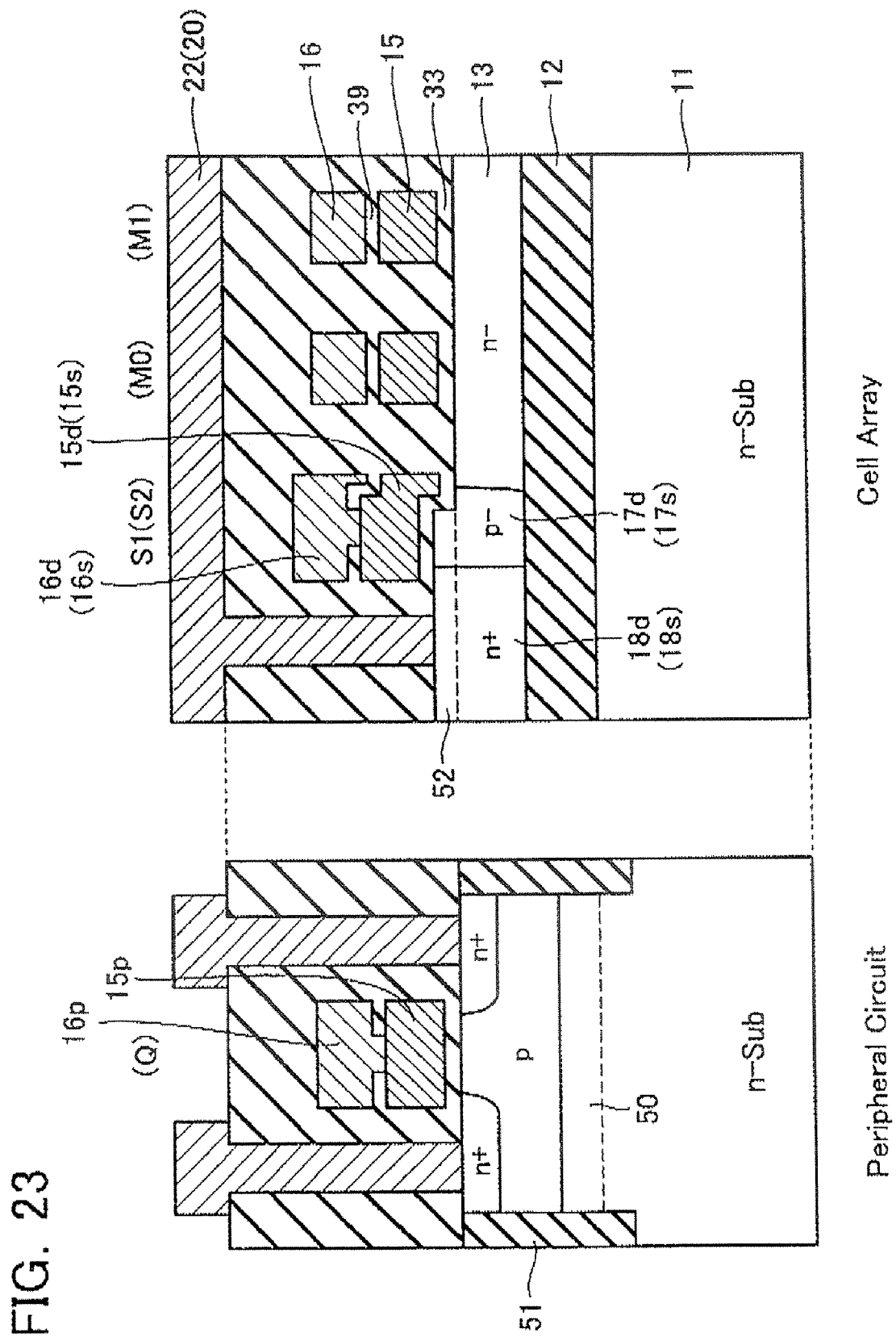
FIG. 23 is a sectional view for explaining still another embodiment which takes note of the peripheral circuit.

FIG. 23 shows another example modified from that shown in FIG. 22. In this example, when the silicon layer 50 is epitaxially grown at the peripheral circuit area, silicon layer 42 is selectively and epitaxially grown simultaneously at the formation areas of the select gate transistors S1 and S2 in the cell array area. As a result, an elevated source/drain structure is introduced into the select gate transistors.

Since this structure is formed prior to gate formation process, it is possible to perform a high temperature process. Further, using this structure, even if the insulating film 12 is thin, it may be avoided such a situation that ions penetrate the insulating film 12 when contact-use n+-diffusion layers 18d, 18s are formed. In addition, in case metal is buried in the source line and bit line contacts, it may be avoided such a situation that metal ions penetrate and reach the bottom of the diffusion layers 18d and 18s, and it causes leakage.

Figure 24:
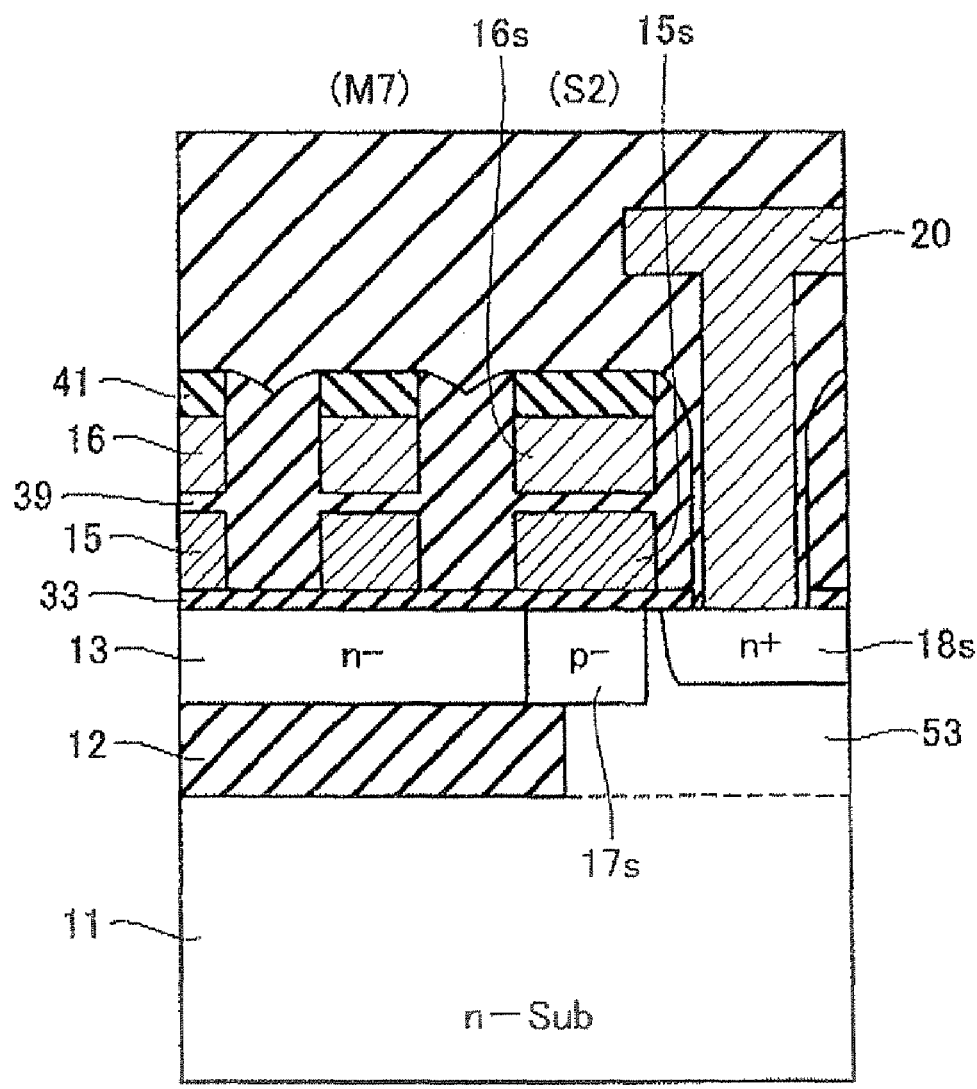
FIG. 24 is a sectional view for showing another embodiment, in which a selective epitaxial layer is formed at the source line contact portion.

FIG. 24 shows still another example modified from that shown in FIG. 22. At the source line side select gate transistor S2, silicon layer 13 and insulating film 12 are also etched as similar to the peripheral circuit area, and silicon layer 53 is formed simultaneously with the silicon layer 50 shown in FIG. 22 with a selective epitaxial growth method. This structure may be used because the source line 20 is operable with the same potential as the substrate 11.

Figure 25:
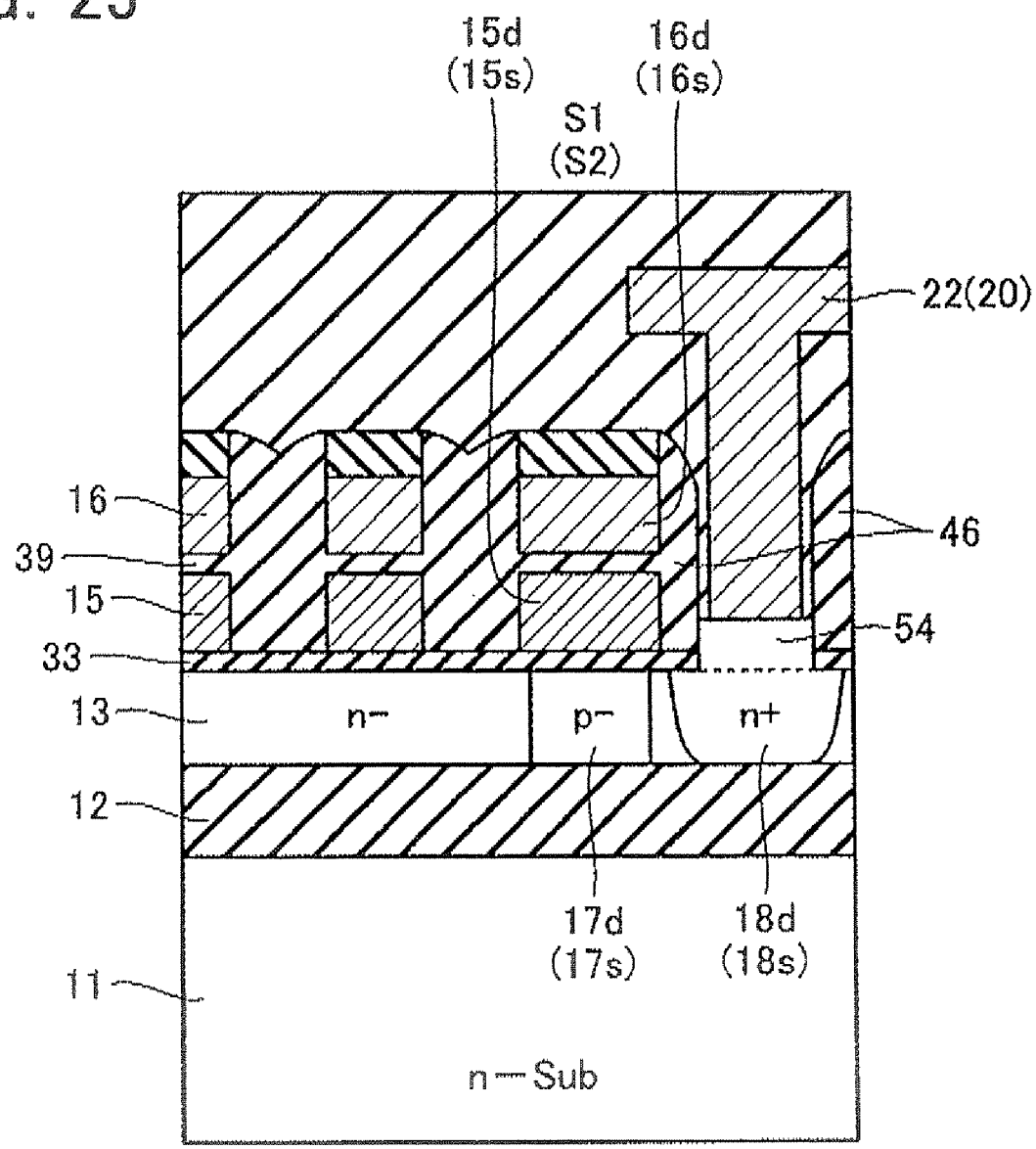
FIG. 25 is a sectional view for showing still another embodiment, in which a selective epitaxial layer is formed at the source line contact portion.

In another example shown in FIG. 25, prior to the formation of n+-type diffusion layer 18d (or 18s), to which the bit line (or source line) is coupled, silicon layer 54 is formed by selective epitaxial growth only at the contact portion in such a state that the gate electrode of the select gate transistor is covered with sidewall insulating film 46. This structure is also effective for preventing ion penetration at the step of forming diffusion layer 18d (or 18s) or metal ion penetration into the boundary of the insulating film 12.

Note here that since the selective epitaxial growth for achieving this structure is performed after the gate formation process, it is in need of using a relatively low temperature process.

This invention is not limited to the above-described embodiment. It will be understood by those skilled in the art that various changes in form and detail may be made without departing from the spirit, scope, and teaching of the invention.

What is claimed is:

1. A method of fabricating a semiconductor memory device with a memory cell array, in which a plurality of memory cells are connected in series and select gate transistors are disposed at both ends thereof, each memory cell having a floating gate and a control gate stacked thereabove, comprising:

forming first impurity-doped layers on a semiconductor layer of a first conductivity type formed over a semiconductor substrate of the first conductivity type with a first insulating film interposed therebetween, the first impurity-doped layers being of a second conductivity type and serving as channel regions of the select gate transistors;

etching the semiconductor layer, on which a floating gate-use electrode material film is formed with a gate insulating film interposed therebetween, to form stripe-shaped device formation areas;

forming a control gate-use electrode material film on the floating gate-use electrode material film with an inter-gate dielectric film interposed therebetween;

selectively etching the control gate-use electrode material film as to penetrate the floating gate-use electrode material film, thereby forming floating gates and control gates of the memory cells and gate electrodes of the select gate transistors;

forming a second insulating film to be buried between the respective memory cells and between the select gate transistors and the memory cells and cover the side walls of the openings at bit line and source line contact portions; and forming second impurity-doped layers of the first conductivity type on the semiconductor layer at the bit line and source line contact portions.

2. The method according to claim 1, wherein
the first impurity-doped layers are formed with the procedures of: forming an ion implantation resistant mask on the semiconductor layer; and performing ion implantation into the semiconductor layer.

3. The method according to claim 1, wherein
the first impurity-doped layers are formed by oblique ion implantation before or after ion implantation for forming the second impurity-doped layers at the bit line and source line contact portions.

4. The method according to claim 1, wherein
the semiconductor layer is in contact with the semiconductor substrate via openings formed in the first insulating film.

5. The method according to claim 1, further comprising:
etching the semiconductor layer and the first insulating film in the peripheral circuit area to expose the semiconductor substrate;
forming an epitaxial semiconductor layer on the semiconductor substrate in the peripheral circuit area; and
forming a peripheral transistor on the epitaxial semiconductor layer with the same gate structure as those of the select gate transistors in the cell array.

6. The method according to claim 5, wherein
the epitaxial semiconductor layer forming process is also adapted to the formation area of the select gate transistors, resulting in that an elevated source/drain structure is introduced into the select gate transistors.

7. The method according to claim 5, wherein
etching process of the semiconductor layer and the first insulating film and forming process of the epitaxial semiconductor layer are also adapted to the formation area of the select gate transistors, resulting in that the select gate transistors are formed on the epitaxial semiconductor layer.

8. The method according to claim 1, further comprising:
performing selective and epitaxial growth of another semiconductor layer on the semiconductor layer at the bit line and source line contact portions via the openings.

9. A method of fabricating a semiconductor memory device with a memory cell array, in which a plurality of memory cells are connected in series and select gate transistors are disposed at both ends thereof, each memory cell having a floating gate and a control gate stacked thereabove, comprising:
forming first impurity-doped layers on a semiconductor layer of a first conductivity type formed over a semiconductor substrate of the first conductivity type with a first insulating film interposed therebetween, the first impurity-doped layers being of a second conductivity type and serving as channel regions of the select gate transistors;
forming a first gate electrode material film on the semiconductor layer with a tunnel insulating film interposed therebetween;
etching from the first gate electrode material film to the semiconductor layer to form stripe-shaped device formation areas in a state that the device formation areas are covered with the first gate electrode material film and separated from each other;
burying a second insulating film between the device formation areas;
forming a second gate electrode material film on the device formation areas to be stacked on the first gate electrode material film;
etching the second gate electrode material film to form separating grooves on the second insulating film;
forming a third gate electrode material film of the second gate electrode material film with an inter-gate dielectric film interposed therebetween;
etching from the third gate electrode material film to the first gate electrode material film to form a multiple control gate lines and select gate lines disposed at both sides thereof, which are formed of the third gate electrode material film, and floating gates of the memory cells, which are formed of the first and second gate electrode material films independently of each other;
forming a third insulating film to be buried between the respective control gate lines and between the select gate lines and the control gate lines and cover the side walls of the openings at bit line and source line contact portions; and
forming second impurity-doped layers of the first conductivity type on the semiconductor layer at the bit line and source line contact portions.

10. The method according to claim 9, wherein
the first impurity-doped layers are formed with the procedures of: forming an ion implantation resistant mask on the semiconductor layer; and performing ion implantation into the semiconductor layer.

11. The method according to claim 9, wherein
the first impurity-doped layers are formed by oblique ion implantation before or after ion implantation for forming the second impurity-doped layers at the bit line and source line contact portions.

12. The method according to claim 9, further comprising:
forming short-circuit-use openings in the third gate electrode material film at the select gate line portions for short-circuiting the third and second gate material films to form the select gate lines, wherein
the second impurity-doped layers are formed by ion implantation into the semiconductor layer performed via the short-circuit-use openings.

13. The method according to claim 9, wherein
the semiconductor layer is in contact with the semiconductor substrate via openings formed in the first insulating film.

14. The method according to claim 9, further comprising:
etching the semiconductor layer and the first insulating film in the peripheral circuit area to expose the semiconductor substrate;
forming an epitaxial semiconductor layer on the semiconductor substrate in the peripheral circuit area; and
forming a peripheral transistor on the epitaxial semiconductor layer with the same gate structure as those of the select gate transistors in the cell array.

15. The method according to claim 14, wherein
the epitaxial semiconductor layer forming process is also adapted to the formation area of the select gate transistors, resulting in that an elevated source/drain structure is introduced into the select gate transistors.

16. The method according to claim 14, wherein
etching process of the semiconductor layer and the first insulating film and forming process of the epitaxial semiconductor layer are also adapted to the formation area of the select gate transistors, resulting in that the select gate transistors are formed on the epitaxial semiconductor layer.

17. The method according to claim 9, further comprising:
performing selective and epitaxial growth of another semiconductor layer on the semiconductor layer at the bit line and source line contact portions via the openings.

* * * * *